(12) United States Patent
Kan

(10) Patent No.: US 9,272,474 B2
(45) Date of Patent: Mar. 1, 2016

(54) 3D MOLD FOR MANUFACTURING OF SUB-MICRON 3D STRUCTURES USING 2-D PHOTON LITHOGRAPHY AND NANOIMPRINTING AND PROCESS THEREOF

(71) Applicant: HELIOS APPLIED SYSTEMS PTD LTD, Singapore (SG)

(72) Inventor: Shyi-Herng Kan, Singapore (SG)

(73) Assignee: HELIOS APPLIED SYSTEMS PTE LTD, Singapore (SG)

(*) Notice: Subject to any disclaimer, the term of this patent is extended or adjusted under 35 U.S.C. 154(b) by 0 days.

(21) Appl. No.: 13/858,509

(22) Filed: Apr. 8, 2013

(65) Prior Publication Data

US 2013/0286485 A1     Oct. 31, 2013

Related U.S. Application Data

(63) Continuation of application No. 12/933,803, filed as application No. PCT/SG2009/000443 on Nov. 23, 2009.

(30) Foreign Application Priority Data

Dec. 22, 2008   (SG) ............................... 200809489-8

(51) Int. Cl.
  *G02B 27/10*    (2006.01)
  *B29D 11/00*    (2006.01)
  (Continued)

(52) U.S. Cl.
  CPC ........... *B29D 11/00365* (2013.01); *B82Y 10/00* (2013.01); *B82Y 40/00* (2013.01); *G02B 3/04* (2013.01); *G02B 3/12* (2013.01); *G03F 7/0002* (2013.01); *G03F 7/2053* (2013.01)

(58) Field of Classification Search
  CPC .. G02B 3/0056; G02B 3/0031; G02B 27/145; G02B 27/144; G02B 3/0012; G02B 17/086
  USPC ................................... 359/619, 618, 627, 628
  See application file for complete search history.

(56) References Cited

U.S. PATENT DOCUMENTS 5,442,482 A *  8/1995  Johnson et al. ............... 359/619
6,168,100 B1   1/2001  Kato et al.
(Continued)

FOREIGN PATENT DOCUMENTS

WO   2005/029179 A2   3/2005
WO   2008/016651 A2   2/2008

OTHER PUBLICATIONS

Shuhui Wu, Jesper Serbin, Min Gu, Two-photon polymerisation for three-dimensional micro-fabrication,Centre for Micro-Photonics and Centre for Ultrahigh-Bandwidth Devices for Optical Systems (CUDOS), Faculty of Engineering and Industrial Sciences, Swinburne University of Technology, Journal of Photochemistry and Photobiology A: Chemistry 181 (2006).*

(Continued)

*Primary Examiner* — James Greece
(74) *Attorney, Agent, or Firm* — Nields, Lemack & Frame, LLC

(57) ABSTRACT

A process to manufacture a 3D mold to fabricate a high-throughput and low cost sub-micron 3D structure product is disclosed. The process integrates use of 2-photon laser lithography and 3D write technology to make a 3D mold of each layer of the 3D structure product, and then use nanoimprinting to form a sheet of polymer film of each layer of the 3D structure from the said 3D mold of that layer. Each layer of the sheet of polymer film is then fabricated into the sub-micron 3D structure product. The 3D mold of each layer of a high-throughput and low cost sub-micron 3D structure product, is further used to make master molds which is then used to form a sheet of polymer film of each layer of the 3D structure to fabricate the sub-micron 3D structure product. Applications using this process are also disclosed.

14 Claims, 18 Drawing Sheets

Illustration of nano-imprinted polymer film of micro lens

(51) Int. Cl.
*B82Y 10/00* (2011.01)
*B82Y 40/00* (2011.01)
*G03F 7/00* (2006.01)
*G03F 7/20* (2006.01)
*G02B 3/04* (2006.01)
*G02B 3/12* (2006.01)

(56) References Cited

U.S. PATENT DOCUMENTS

| | | | |
|---|---|---|---|
| 2002/0182241 | A1 | 12/2002 | Borenstein et al. |
| 2004/0202865 | A1 | 10/2004 | Homola et al. |
| 2005/0116370 | A1* | 6/2005 | Ogino et al. ............... 264/40.1 |
| 2005/0186515 | A1 | 8/2005 | Watkins |
| 2007/0121213 | A1* | 5/2007 | Tseng et al. ................ 359/628 |
| 2007/0134362 | A1 | 6/2007 | Heidari |
| 2007/0218544 | A1 | 9/2007 | Ying et al. |
| 2007/0238037 | A1 | 10/2007 | Wuister et al. |
| 2007/0264424 | A1* | 11/2007 | Wang ........................... 427/162 |
| 2008/0026464 | A1 | 1/2008 | Borenstein et al. |
| 2009/0046362 | A1 | 2/2009 | Guo et al. |
| 2010/0294146 | A1 | 11/2010 | Fragala et al. |
| 2011/0046764 | A1 | 2/2011 | Kan |

OTHER PUBLICATIONS

Multiphoton polymerization Linjie Li1 and John T. Fourkas, Materials Today Jun. 30, 2007 | vol. 10 | No. 6.*
Polymers for flexible displays: From material selection to device applications, Myeon-Cheon Choia, Youngkyoo Kimb, Chang-Sik Ha Prog. Polym. Sci. 33 (2008) 581-630.*
Advances in 3D nano/microfabrication using two-photon initiated polymerization, Kwang-Sup Leea, Ran Hee Kima, Dong-Yol Yangb, Sang Hu Park, Prog. Polym. Sci. 33 (2008) 631-681.*
Nanotechnology 16 (2005), pp. 1874-1877, "Fabrication of a 50 nm half-pitch wire grid polarizer using nanoimprint lithography", Ahn, et al.
Microelectronic Engineering 61-62 (2002), pp. 25-31, "Nanoimprint lithography for organic electronics", Cedeno, et al.
Biomaterials 27 (2006), pp. 3973-3979, "Bone regeneration on computer-designed nano-fibrous scaffolds", Chen, et al.
J. Vac. Sci. Technol. B, 20(6), Nov./Dec. 2002, pp. 2877-2880, "High-resolution organic polymer light-emitting pixels fabricated by imprinting technique", Cheng, et al.
Applied Physics Letters 67 (21), Nov. 20, 1995, pp. 3114-3116, "Imprint of sub-25 nm vias and trenches in polymers", Chou, et al.
Proceedings of the IEEE, vol. 85, No. 4, Apr. 1997, pp. 652-671, "Patterned Magnetic Nanostructures and Quantized Magnetic Disks", Chou.
Optics Express, vol. 14, No. 6, Mar. 20, 2006, pp. 2323-2334, "Bilayer Al wire-grids as broadband and high-performance polarizers", Ekinci, et al.
Adv. Mater., 2007, V 19, pp. 495-513, "Nanoprint Lithography: Methods and Material Requirements", Guo.
Applied Physics Letters 71 (13), Sep. 29, 1997, pp. 1881-1883, "Nanoscale silicon field effect transistors fabricated using imprint lithography", Guo, et al.
Journal of Modern Optics, 2002, vol. 49, No. 3/4, pp. 663-673, "Fabrication of photonic nanostructures in nonlinear optical polymers", Guo, et al.
Applied Physics Letters, vol. 85, No. 15, Oct. 11, 2004, pp. 3005-3007, "Bottom-up soft-lithographic fabrication of three-dimensional multilayer polymer integrated optical microdevices", Huang, et al.
Proceedings of SPIE, vol. 6151 (2006), pp. 61512J-1-61512J-8, "UV-Nanoimprint Lithography Using a Diamond-Like Carbon Stamp", Jeong, et al.
IEEE Transactions on Electron Devices, vol. 52, No. 8, Aug. 2005, pp. 1722-1726, "Fabrication of Large-Scaled Organic Light Emitting Devices on the Flexible Substrates Using Low-Pressure Imprinting Lithography", Kao, et al.

Nature, vol. 412, Aug. 16, 2001, Brief Communications, pp. 697-698, "Finer features for functional microdevices", Kawata, et al.
Applied Physics Letters, 88, 2006, pp. 063513-1-063513-3, "Micron-scale organic thin film transistors with conducting polymer electrodes patterned by polymer inking and stamping", Li, et al.
J. Vac. Sci. Technol. B, 21(6), Nov./Dec. 2003, pp. 2783-2787, "Nanoimprint lithography process optimization for the fabrication of high electron mobility transistors", MacIntyre, et al.
Nano Letters, vol. 3, No. 4, 2003, pp. 443-445, "Nanoimprint Lithography for Hybrid Plastic Electronics", McAlpine, et al.
Nature Medicine, vol. 14, No. 2, Feb. 2008, pp. 213-221, "Perfusion-decellularized matrix: using nature's platform to engineer a bioartificial heart", Ott, et al.
Adv. Mater. 2004, 16, No. 6, Mar. 18, pp. 525-529, "Room-Temperature Nanoimprint Lithography of Non-thermoplastic Organic Films". Pisignano, et al.
Synthetic Metals 153 (2005), pp. 237-240, "First-order imprinted organic distributed feedback lasers", Pisignano, et al.
Proceedings of SPIE, vol. 6992, (2008), pp. 699217-1-699217-10, "Rapid prototyping of micro-optics on organic light emitting diodes and organic photo cells by means of two-photon 3D lithography and nano-imprint lithography", Satzinger, et al.
Differentiation (2005) 73: 121-133, "Molecular, cellular and develpmental biology of urothelium as a basis of bladder regeneration", Staack, et al.
J. Vac. Sci. Technol. B 16(6), Nov./Dec. 1998, pp. 3926-3928, "Roller nanoimprint lithography", Tan, et al.
Microelectronic Engineering, 73-74 (2004), pp. 535-541, "3D patterning by means of nanoimprinting, X-ray and two-photon lithography", Tormen, et al.
The Journal of Thoracic and Cardiovascular Surgery, Feb. 2005, vol. 129, No. 2, pp. 470-472, Brief Communications, "Advances in tissue engineering: Cell printing", Varghese, et al.
Laser Focus World, 2005, 41, 76, 4 pages, "Diffractive Optics: Nanoimprint lithography enables fabrication of subwavelength optics", Wang, et al.
Optics Letters, vol. 30, No. 2, Jan. 15, 2005, pp. 195-197, "High-performance nanowire-grid polarizers", Wang, et al.
Biomaterials 28 (2007), pp. 45-54, "The mechanical properties and osteoconductivity of hydroxyapatite bone scaffolds with multi-scale porosity", Woodard, et al.
J. Vac. Vac Sci. Technol. B 16(6), Nov./Dec. 1998, pp. 3825-3829, "Large area high density quantized magnetic disks fabricated using nanoimprint lithography", Wu, et al.
International Search Report/Written Opinion dated Apr. 13, 2010 in corresponding PCT application No. PCT/SG2009/000443.
Office Action—Restriction—mailed Dec. 18, 2012 in corresponding U.S. Appl. No. 12/933,803.
Office Action mailed May 7, 2013 in corresponding U.S. Appl. No. 12/933,803.
MRS Proceedings, vol. 1438, 2012 MRS Spring Meeting, "Flexible Optical Interconnects via Thiol-ene Two-photon-induced Polymerization", 1 page abstract, Kumpfmueller, et al.
SPIE Newsroom, Nov. 29, 2012, Micro/Nano Lithography, "3D molding processes based on two-photon microfabrication", 4 pages, Maruo.
Proc. SPIE 8630, Optoelectronic Interconnects XIII, 863002, Feb. 22, 2013, "Chip-to-board interconnects for high-performance computing", 1 page abstract, Riester, et al.
Proc. SPIE 6476, Optoelectronics Integrated Circuits IX, 64760P, Feb. 15, 2007, "Application of 2-photon 3D lithography for the fabrication of embedded ORMOCER waveguides", 1 page abstract, Schmidt, et al.
Proc. SPIE 7591, Advanced Fabrication Technologies for Micro/Nano Optics and Photonics III, 759114, Feb. 16, 2010, "Multi-photon polymerization of inorganic-organic hybrid polymers using visible or IR ultrafast laser pulses for optical or optoelectronic devices", 1 page abstract, Steenhusen, et al.
Appl. Opt., 52(3), Jan. 2013, pp. 388-393, "Development and characterization of optoelectronic circuit boards produced by two-photon polymerization using a polysiloxane containing acrylate functional groups", 1 page abstract, Woods, et al.

(56) References Cited

OTHER PUBLICATIONS

Final Rejection mailed Jan. 29, 2014 in corresponding U.S. Appl. No. 12/933,803.
Office Action mailed Feb. 24, 2015 in corresponding U.S. Appl. No. 12/933,803.
Final rejection mailed Sep. 23, 2015 in co-pending U.S. Appl. No. 12/933,803.
Notice of Allowance mailed Jan. 13, 2016 in co-pending U.S. Appl. No. 12/933,803.

* cited by examiner

General process flow for the fabrication of 3D molds.

Process flow for the preparation of silicon wafer for 2-photon lithography scanning Fabrication process of a secondary mold Fabrication process flow of roller NIL molds.

Fabrication process of a flexible polymer mold

Fabrication of sheet metal mold by physical stamping of nickel mold on a sheet of aluminium Illustration of nano-imprinted polymer film of micro lens 1. Initial Setup 2. Nanoimprinting 3. Mold Removal Steps in Nano imprint lithography process Comparison of different fabrication technologies

3D MOLD FOR MANUFACTURING OF SUB-MICRON 3D STRUCTURES USING 2-D PHOTON LITHOGRAPHY AND NANOIMPRINTING AND PROCESS THEREOF

This application is a continuation of U.S. patent application Ser. No. 12/933,803 filed Sep. 21, 2010, which is a 371 of PCT/SG2009/000443 filed Nov. 23, 2009, which claims priority of Singapore Patent Application No. 200809489-8 filed Dec. 22, 2008, the disclosures of which are incorporated herein by reference.

FIELD OF INVENTION

The present invention relates to a 3D mold for manufacture of sub-micron 3D structures using a process which integrates 2-photon lithography and nanoimprinting to manufacture high-throughput and low cost sub-micron 3D structures.

BACKGROUND

Two-photon lithography is a very powerful, yet simple technique to produce complex, three-dimensional structure from a liquid, photosensitive material. Two-photon polymerization (TPP) is based on the simultaneous absorption of two photons, which induce chemical reactions between starter molecules and monomers within a transparent matrix. The absorption of 2 photons requires extremely high peak intensities, thus an ultra-short pulse laser is needed to provide the high intensity. Previously, the most common application of two-photon absorption (TPA) has been two-photon confocal microscope where the fluorescence of a dye molecule is observed after being excited by the means of TPA. Single-photon absorption used in standard photo- and stereolithograpic techniques is inherently two-dimensional, since ultra-violet light is absorbed by the resin within the first few micrometers. Since the photosensitive resins are transparent in the near-infrared (NIR) region, NIR laser pulses can be focused into the volume of the resin. As the laser focus is moved three-dimensionally through the volume of the resin, the polymerization process is initiated along the path allowing the fabrication of any 3D microstructure.

The rate of TPA is non-linear or quadratic dependent on incident intensity, therefore making it possible to achieve lateral resolutions better than 100 nm in the polymerized structures. For many applications that requires 3D structures, such as tissue engineering scaffolds, biomedical implants, micro-lens, micro optics and other micro devices (MEMS) requires 3D resolutions in a few microns, the TPP process offer a fast and simple way to achieve the desired resolutions.

Nanoimprint Technology

The principle of nanoimprint is straightforward. A schematic of the process developed in the original NIL process is shown in FIG. 15. A hard mold that contains micron-nanoscale surface relief features is pressed into a polymeric material cast on a substrate at a controlled temperature and pressure, thereby creating a thickness contrast in the polymeric material. A thin residual layer of polymeric material is left underneath the mold protrusions and acts as a soft cushioning layer that prevents direct impact of the hard mold on the substrate and effectively protects the delicate nanoscale features on the mold surface. For most applications, this residual layer needs to be removed by an anisotropic $O_2$ plasma-etching process to complete the pattern definition.

A variation of nanoimprint has also been developed known as Step and Flash Imprint Lithography (SFIL) or UV nanoimprint lithography. In this technique, a transparent mold and UV-curable precursor liquid to define the pattern is used, allowing the process to be carried out in room temperature, as illustrated in FIG. 16.

DISCUSSION OF PRIOR ART

Use of 2-Photon Lithography in the Fabrication of 3D Template/Mold for Nanoimprint Current NIL technologies rely on e-beam lithography, laser writers and optical lithography technologies to write the designs of the device onto the NIL templates. Unfortunately these technologies are inherent 2D writing technologies and are unable to fabricate 3D structures required by many NIL applications. Although current investigators get around this problem by a multi-layer processing, this is not an effective long term manufacturing solution to obtain low cost 3D nanostructures. The steps or effects of grayscale produced by multi-layer process are also not acceptable in many applications.

The proposed use of 2-photon lithography in nanoimprint template fabrication is novel. For application with simple 3D requirements, such as hemispherical structures, the stamping process could be performed in a single step, eliminating the need for a multi-stamping overlay process.

2-photon lithography has an extremely high write resolution (~100 nm) compared to conventional laser writer (~600 nm). Furthermore, similar to conventional laser writers, 2-photon lithography has comparatively high writing speed compared to e-beam writers, making this technology ideal for most write applications except those that require resolutions less than 100 nm.

Use of 3D Nanoimprint in Tissue Engineering and Other Applications

Currently, there are no known groups working on the development of organ/tissue scaffolds using 3D nanoimprint technologies. Stacking layers of imprinted structures onto each other would make this rapid prototyping technique with the highest resolution and with comparatively high throughputs. This process does not suffer as much material constrains compared to other rapid prototyping processes, as it relies on a physical stamping process to define its features.

Application of the technology developed under this invention could be used in fabricating unique photonics structures on polymer thin film to generate functional film. An example of such film could be the fabrication of micro lens in the configuration. The advantage of having a high resolution tool such as the 2-photon lithography tool to fabricate micro-lens is that curvature of the lens could be achieved using very thin film. The advantages of such an approach are 1) lower material cost;
2) smooth lens surface would cause less lost of light; and
3) thinner use of polymer thin film will ensure less absorption of light.

Although the NIL approaches have been designed to provide a solution to lithography in the next generation semiconductor wafer fabrication, scientist and engineers have been working on numerous applications in hybrid plastic electronics, organic electronics, novel Silicon devices, novel Gallium Arsenide devices, organic lasers, photonics, non-linear optical polymer structures, high resolution organic light-emitting diode (OLED pixels), diffractive optical elements, broadband polarizer, hard disk drive, DNA manipulation, nanoscale protein patterning and cell culture. Currently, the NIL technology is used by the hard drive industry in the fabrication of disk media.

The critical technical steps in NIL are separated into
1) mold fabrication,
2) resist, and
3) processes.

OBJECTIVE OF THE INVENTION

The inventive process uses a high-throughput sub-micron 3D structure technology which integrates multiple state of the art technologies,
[1] 2-photon lithography
[2] nanoimprint, and
[3] roll-to-roll nanoimprint.

By leveraging on the advantages of each technology it is possible to produce sub-micron 3D structures at a low cost. This approach is similar to the approach in the semiconductor wafer manufacturing industry, where the integrated circuit on a silicon wafer is manufactured, using many expensive capital equipment for high volume production while reducing the cost of each individual component.

The technology of this inventive process deviates from conventional NIL technology right from the mold fabrication step. Conventional NIL templates are patterned using e-beam lithography or optical lithography, fundamentally these patterning technologies are 2D in nature. However, the inventive proposes the use of 2-photon lithography and a 3D write technology to pattern the template. The patterned mold would be 3D.

SUMMARY OF THE INVENTION

A first object of the invention is a process to manufacture a 3D mold to fabricate a high-throughput and low cost sub-micron 3D structure product, the said process integrating 2-photon lithography and nanoimprinting, characterized by the use of 2-photon laser lithography and 3D write technology to make a 3D mold of each layer of the 3D structure product and using nanoimprinting to form a sheet of polymer film of each layer of the 3D structure from the said 3D mold of that layer, fabricating each layer to make the sub-micron 3D structure product.

A second object of the invention is a 3D mold of a layer of a high-throughput and low cost sub-micron 3D structure product, wherein the 3D mold of the layer is created by using 2-photon laser lithography and 3D write technology to make a 3D mold of each layer of the 3D structure product and using nanoimprinting to form a sheet of polymer film of each layer of the 3D structure to make the 3D mold of that layer of the sub-micron 3D structure product.

Preferably, the 3D mold of a layer of a high-throughput and low-cost sub-micron 3D structure product uses a process which integrates 2-photon lithography and nanoimprinting as claimed in any of the preceding claims, wherein the 3D mold of the layer is manufactured as follows:
  creating a design of a 3D layer of the 3D structure;
  setting up a writing process to produce an 3D image of the layer of the 3D structure product using a 2-photon lithography tool;
  developing a photo resist/polymer of the 3D image of the layer on a substrate;
  sputtering one or more layers of metal onto the surface of the photoresist/polymer of the 3D image of the layer to form a seed metal layer;
  transferring the 3D polymer image coated with the seed metal layer by an electroplating process to form a 3D metal mold;
wherein the 3D metal mold will be used to manufacture copy of the 3D image of the same layer of the 3D structure product.

Advantageously, the step of creating a design of a mold of a 3D layer of the sub-micron 3D structure product includes anchoring the base of 3D CAD at the surface of the substrate, compensating for polymer shrinking and making it mechanically strong to prevent the sub micron 3D structure from collapsing during the rinsing and drying process.

Advantageously in the step of setting up a writing process to produce a mold of a 3D layer, the 3D image of each layer is an image from 0.01 micron to 150 microns thickness.

Advantageously for the step of setting up a writing process to produce a mold of a 3D layer, the 3D image of each layer is preferably an image of 100 microns thickness.

Advantageously, for the step of setting up a writing process to produce a mold of a 3D layer, the parameters of each layer from 0.01 microns to 100 microns thickness is used as input for the manufacture of a mold of that layer.

Advantageously, for the step of setting up a writing process to produce a mold of a 3D layer. the parameters of each layer is preferably 100 microns is used as input for the manufacture of a mold of that layer.

Preferably, each layer of the 3D image is from 0.01 microns to 150 microns.

Advantageously, for the step of developing a photo resist/polymer of the 3D image of the layer on a substrate, the step includes cleaning the substrate, applying a spin coat resist onto the substrate, removing any photo resist on the back of the substrate with a solvent, pre-baking the substrate, if necessary, placing the substrate on a vacuum chuck, turning on the vacuum, aligning a wafer, inputting the correct process parameters, marking and checking the substrate to ensure that every device is correctly positioned and removing the photo resist/polymer of the slice of the image of that layer of the substrate.

Advantageously for the step of forming a seed metal layer by sputtering one or more layers of metal onto the surface of the resist/polymer of the image, the step includes checking there are no residues of photoresist or other materials left on the substrate, placing the wafer in a sputtering tool, pumping the chamber down to base pressure, performing a short plasma clean process to ensure the surface is clean, depositing one or more metallic layers, layer by layer to form the seed metal layer and removing the wafer from the chamber.

Advantageously, for the step of transferring of the polymer image formed from the seed metal layer by an electroplating process to form a metal mold, the step includes placing the substrate with the seed metal layer in an electroplating bath, setting the electroplating parameters, plating until the desired thickness is achieved, removing the wafer from the holder, removing the resist from the 3D mold, rinsing the mold thoroughly with de ionized water, grinding the back and edges of the 3D mold to size, rinsing the 3D mold in de ionized water, performing $O_2$ plasma cleaning on the surface of the 3D mold.

Advantageously, for the step of transferring of the polymer image formed from the seed metal layer by an electroplating process to form a metal mold, the step includes placing the substrate with the seed metal layer in an electroplating bath, setting the electroplating parameters, plating until the desired thickness is achieved, removing the wafer from the holder, removing the resist from the 3D mold, rinsing the mold thoroughly with de ionized water, cutting the back and edges of the 3D mold to size, rinsing the 3D mold in de ionized water, performing $O_2$ plasma cleaning on the surface of the 3D mold.

Advantageously for the step of transferring of the polymer image formed from the seed metal layer by an electroplating process to form a metal mold, the step includes placing the substrate with the seed metal layer in an electroplating bath, setting the electroplating parameters, plating until the desired thickness is achieved, removing the wafer from the holder, removing the resist from the 3D mold, rinsing the mold thoroughly with de ionized water, punching the back and edges of the 3D mold to size, rinsing the 3D mold in de ionized water, performing $O_2$ plasma cleaning on the surface of the 3D mold.

Advantageously for the step of fabricating a mold, the step includes coating a substrate with photoresist, setting the process parameters for the stamping tool, transferring the 3D image from the metal mold onto a large substrate through a series of stamp and step sequence, developing the resist after processing, de-laminating the resist/polymer from the substrate, wrapping the substrate over a jig to form a cylinder, electroplating the cylinder until the desired thickness is achieved, grinding and polishing the cylinder to the correct finish and thickness, Advantageously the step of fabricating a mold includes a master mold and secondary molds.

Advantageously, for the step of fabricating a mold, a mold is made for an upper surface of a layer of a 3D structure and another mold is made for a lower surface of the same layer of a 3D structure, and each layer is then aligned and zipped together to adhere together to form multiple layer structures.

Advantageously, for the step of using the molds in a nanoimprinting process, the nanoimprinting process includes Thermal NIL or UV NIL or Roll-to-roll NIL.

Preferably, for the fabrication of the 3D mold, the 2-photon lithography uses proprietary software to fabricate 3D molds of any shape and molds of different shapes which can be combined to form complex molds.

Preferably, for the fabrication of the 3D mold, the initial template is 3D in shape (hemispherical or other shape with curved side walls) compared to typical grayscale structures, which has vertical or sloping side walls.

Preferably, for the 3D mold, the mold made of flexible polymer is attached onto the surface of a cylinder to form a roller of flexible polymer mold, for nanoimprinting.

Preferably, for the 3D mold, the mold made of sheet metal is attached onto the surface of a cylinder to form a roller of sheet metal mold with polymer features, for nanoimprinting.

Preferably, for the 3D mold, the mold made of sheet aluminum is attached onto the surface of a cylinder to form a roller of sheet aluminum mold with metal features stamped on using a nickel master mold, for nanoimprinting.

Preferably, for the 3D mold, the mold made of sheet metal having metal features electroplated onto its surface is attached onto the surface of a cylinder to form a roller of sheet metal mold with metal features, for nanoimprinting.

Preferably, the process of fabricating a 3D mold follows the NIL process flow, and includes:

improved designs in mold manufacturing with library of shapes to establish design rules for mass manufacturing of 3D devices, making molds with these 3D templates use of the stamp on NIL thermal, UV, stamping and roll-to-roll technology A third object of the invention is a system to manufacture a 3D mold to fabricate a high-throughput and low cost sub-micron 3D structure product, the said system integrating 2-photon lithography and nanoimprinting characterized by the use of 2-photon laser lithography and 3D write technology to make a 3D mold of each layer of the 3D structure and using nanoimprinting to form a sheet of polymer film of each layer of the 3D structure from the 3D mold, and stacking each layer of the 3D structure to fabricate the sub-micron 3D structure product.

Preferably, the system to manufacture a 3D mold to fabricate a high-throughput and low cost sub-micron 3D structure products uses 3D write technology to pattern a template for the 3D mold.

Preferably, the system to manufacture high-throughput and low cost sub-micron 3D structure products uses nanoimprinting which is Thermal NIL thermal or UV NIL or Roll-to-Roll nanoimprinting.

A fourth object of the invention is a plurality of 3D molds to fabricate organ/tissue scaffolds, wherein plurality of layers of images of 3D structures of whole organ scaffolds of complex organs such as kidney or liver, are created, including the following:

a. Organ/tissue scaffolds fabricated by slicing a 3D CAD design of the scaffold into multiple layers, each layer being individually fabricated using nanoimprint to overlay and bond all layers to form the final scaffolds, creating such scaffolds which are anatomically similar to those created in vivo physical environment.

b. Tissue engineering scaffolds.

c. Fabrication of medical implantable devices

A fifth object of the invention is a 3D mold is to fabricate simple 3D structures such as sinusoidal structures and hemispheres in a single pass, wherein a single stamping nanoimprinting process is used in the manufacture of photonics, LCD industry, holographic tags, micro lens for focusing, bandages.

Preferably, for the 3D mold to fabricate simple 3D structures, the material used in the NIL process could be either synthetic or biological material.

A sixth object of the invention is a plurality of 3D molds for manufacture of scaffolds for tissue engineering, comprising the following steps:

a. creating a 3D template using 2-photon lithography.

b. transferring the 3D image onto a 3D mold by electroforming or any type of forming techniques, such as e-beam lithography or optical lithograph, depending on the type of molds (flexible, hard, size, surface properties, and resolution) needed for the processing.

c. designing the structures with a computer aided design program (CAD).

d. using proprietary software with the 3D CAD drawing as input to automatically slice the said structures into multiple layers.

e. eliminating layers with repeated patterns.

f. fabricating templates for mold making.

g. fabricating a master mold for each layer to produce a hard/flexible mold for a stamping/roll-to-roll nanoimprint tool.

h. sandwiching each layer produced onto each other to form a complete organ scaffold with physical dimensions close to an actual natural scaffold.

A seventh object of the invention is a 3D mold for manufacture of medical devices such as bridges for nerves and bones requiring physical cues to guide growth of nerves and bones, comprising the following steps:

a. creating a 3D template using 2-photon lithography.

b. transferring the 3D image onto a mold by electroforming or any type of forming techniques, such as e-beam lithography or optical lithograph depending on the type of molds (flexible, hard, size, surface properties, and resolution) needed for the processing.

c. designing the structures with a computer aided design program (CAD).

d. using proprietary software with the 3D CAD drawing as input to automatically slice the said structures into multiple layers.

e. eliminating layers with repeated patterns.

f. fabricating templates for mold making g. fabricating a master mold for each layer to produce a hard/flexible mold for a stamping/roll-to-roll nanoimprint tool.

h. sandwiching each layer produced onto each other to form a complete organ scaffold with physical dimensions close to an actual natural scaffold.

An eighth object of the invention is a 3D mold for manufacture of customized micro-lens to form a more functional optical film, comprising the following steps:

a. creating a 3D template using 2-photon lithography.

b. transferring the 3D image onto a mold by electroforming or any type of forming techniques, such as e-beam lithography or optical lithograph, depending on the type of molds (flexible, hard, size, surface properties, and resolution) needed for the processing.

c. designing the structures with a computer aided design program (CAD).

d. using proprietary software with the 3D CAD drawing as input to automatically slice the said structures into multiple layers.

e. eliminating layers with repeated patterns.

f. fabricating templates for mold making g. fabricating a master mold for each layer to produce a hard/flexible mold for a stamping/roll-to-roll nanoimprint tool.

h. sandwiching each layer produced onto each other to form a complete optical film made entirely of compound micro-lens with custom designed curvatures wherein the optical film can be incorporated onto the surface of a thin film or a thin layer of glass to reduce reflection, total internal reflection, collect light and focus the light collected onto active devices.

These and other objects of the invention will no doubt become obvious to those of ordinary skill in the art after reading the following detailed description which follows, and which may be learned by practice of the invention by those skilled in the art.

BRIEF DESCRIPTION OF THE DRAWINGS

The accompanying drawings which are incorporated in and constitute a part of the specification illustrate examples of the processes referred to in the invention and together with the general description, serve to explain the principles of the invention.

DETAILED DESCRIPTION OF THE INVENTION

Figure 1:
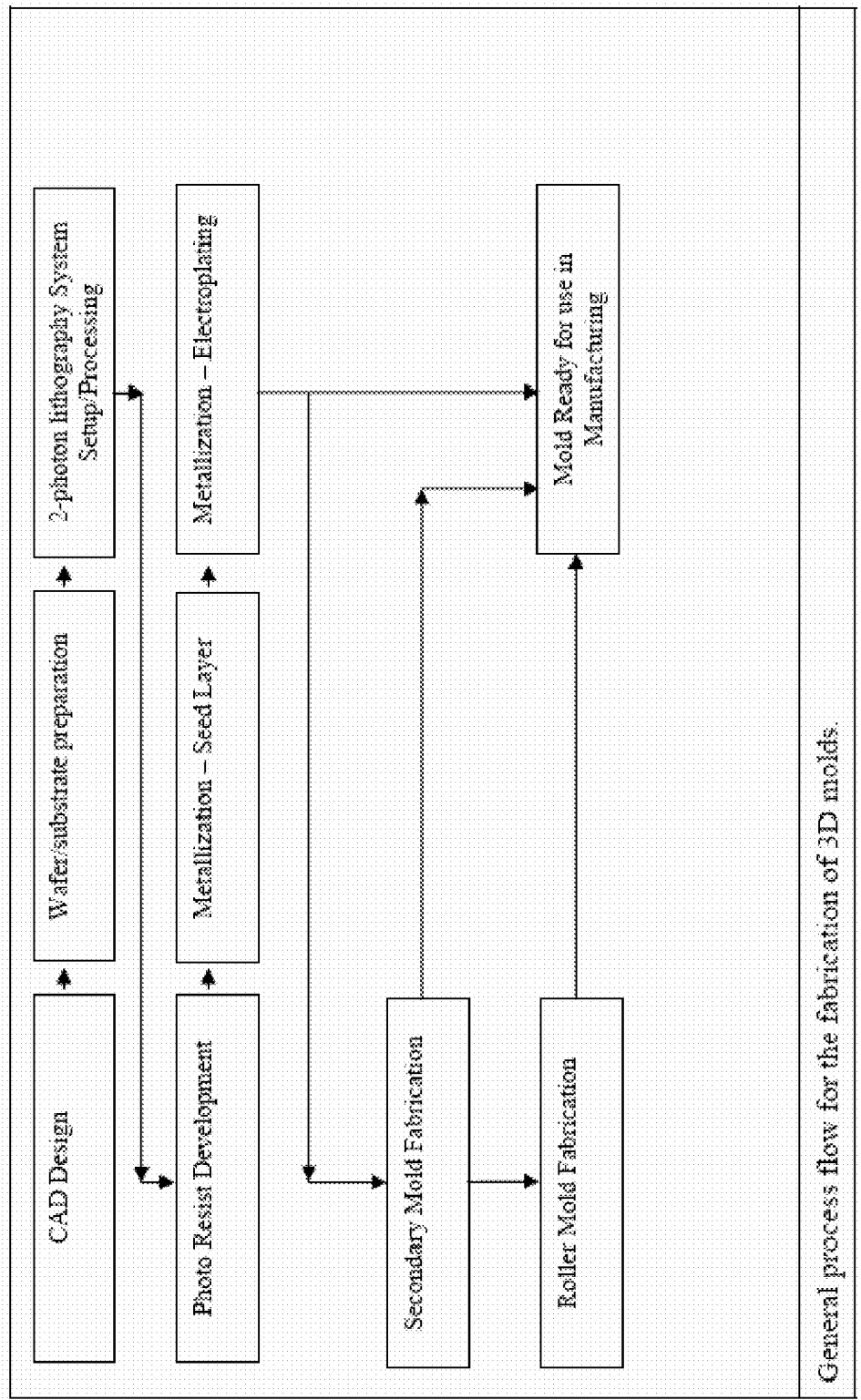
FIG. 1 is a process flow of the steps in fabricating a sub micron 3D mold of this inventive process.

The process flow of the steps in fabricating a sub micron 3D mold of this inventive process is shown in FIG. 1. The general process procedure and steps are as follows:

1) 3D CAD designs are input into the 2-photon lithography step of this inventive process.

2) The files are then pre-processed by the tool software, where the 3D design is sliced into layers 100 nm thick.

3) Each layer is then scanned onto the surface of wafers/substrate coated with resists.

4) The resist is then developed.

5) A metal seed layer is next deposited onto the resist template.

6) An electroplating step then follows.

7) Mold is now ready for stamping or to be use as a master mold to produce secondary mold or roller imprint molds FIG. 2 to FIG. 9 illustrates each of the steps in the general process procedure.

Figure 2:
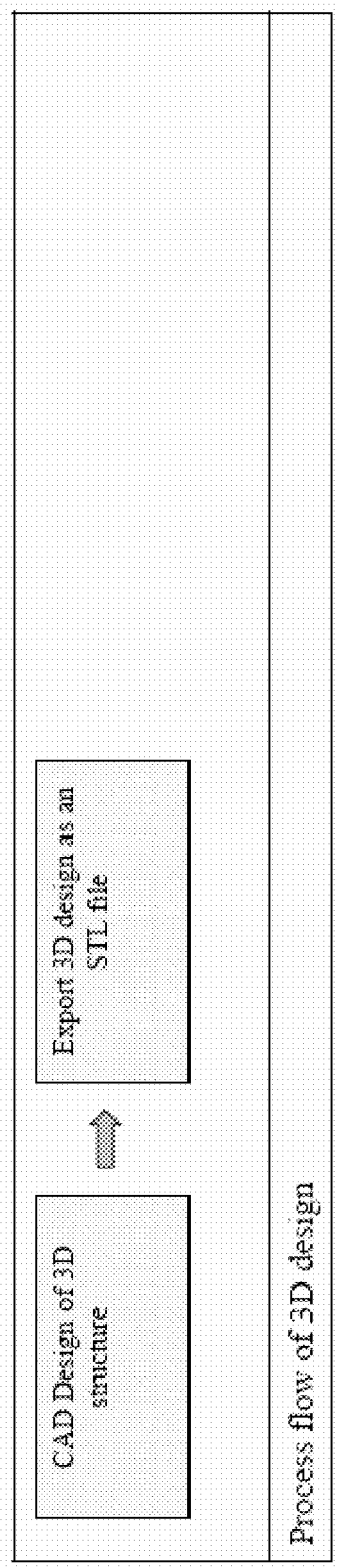
FIG. 2 is a process flow for the first step of creating 3D CAD designs as inputs into the 2-photon lithography step of this inventive process.

FIG. 2 is a process flow for the first step of creating 3D CAD designs as inputs into the 2-photon lithography of this invention. The designs of 3D structures are created and exported as 3D designs in STL file format in the following manner:

1) Mechanical 3D designs, structures could be drafted using 3D CAD programs which is known in the art.

2) Design rules that has to be followed.

a. The base of the 3D design will have to be anchored at the surface of the substrate; this is to prevent the structure from drifting during marking b. The structure will have to be designed such that the solvent used in the development process is able to remove unexposed polymer.

c. The structure will have to be designed such that it will be able to compensate for polymer shrinking after development.

d. The structure will have to be mechanically strong, to prevent device collapsing during the rising and drying process.

Figure 3:
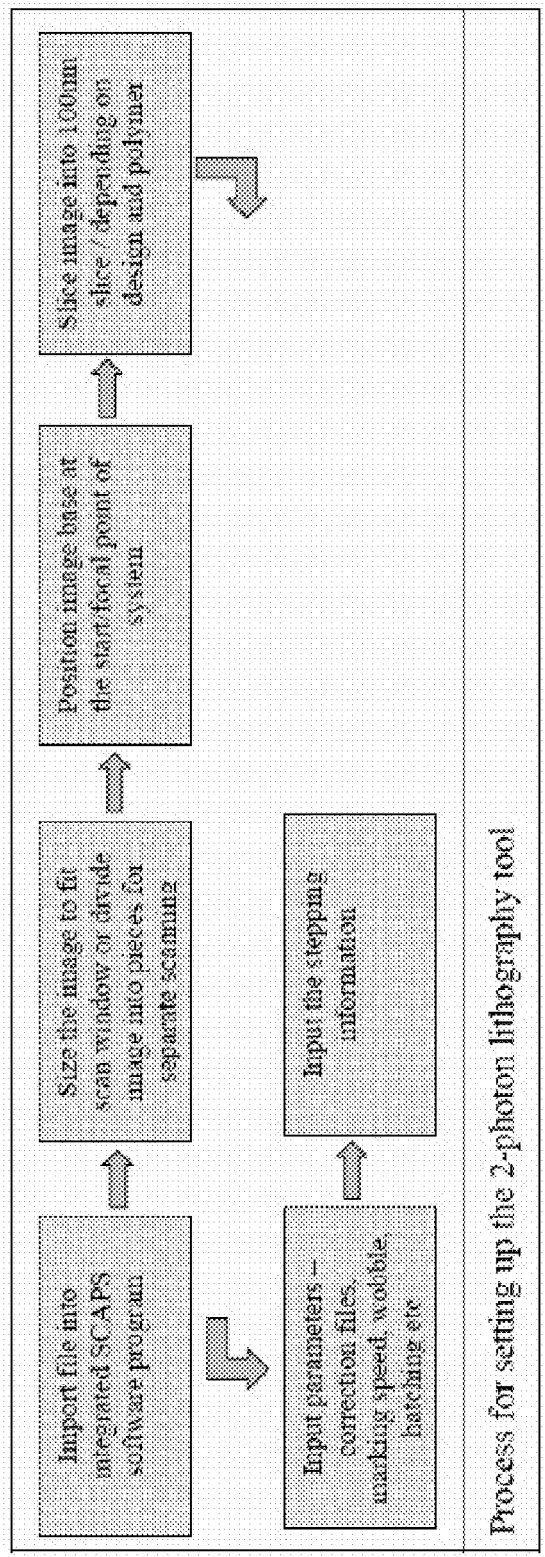
FIG. 3 is a process flow for setting up the 2-photon lithography tool for the step of writing in this inventive process.

These designs of 3D structures are exported as STL file format for further processing FIG. 3 is a process flow for setting up the 2-photon lithography tool for the step of writing in this inventive process. What is described herein is a generic process and some process steps will be eliminated or added to meet specific requirements:

1) First the STL file with the 3D CAD design is imported into the customized laser scanning software known in the art.

2) Next the size of the image is corrected to ensure that the image input into customized laser scanning software is correctly scaled to the correct physical size.

3) Input position of laser focus into system to provide initial wafer alignments 4) Slice the image into 100 nm thick slices. (this thickness could be varied based on the desired resolution of final device)

5) Input the correct parameter for polymer used in process.
   a. Power of laser—essentially controls the resolution and scanning time of the job.
   b. Scan speed—The scan speed will impact on the resolution (spot size)
   c. Correction files—This is determined by the type of lens and polymer being used for the job. By selecting the correct correction file, image distortion will be minimized.
   d. Wobble—By wobbling the laser the effective spot size of the laser can be increased. This will increase the throughput of the system, as well as providing different texture on the surface of fabricated devices.
   e. Hatching—Hatching will determine the number of line scan that will be performed to fill an area that needs to be filled. Varying the hatching pattern will also affect the surface texture of the fabricated device.
   f. Other factors that will affect the scanned device—Jump speed (corner sharpness), acceleration (consistent line thickness), field size (a larger scanning field would mean that the device would be more prone to distortion at the edge of field), docking position of the laser (if incorrectly docked, the scattered laser light would partially polymerize resists), stepping size (gap and street between structure, will also affect the stitching of larger devices), stepping pattern (affect device to device accuracy).

Figure 4:
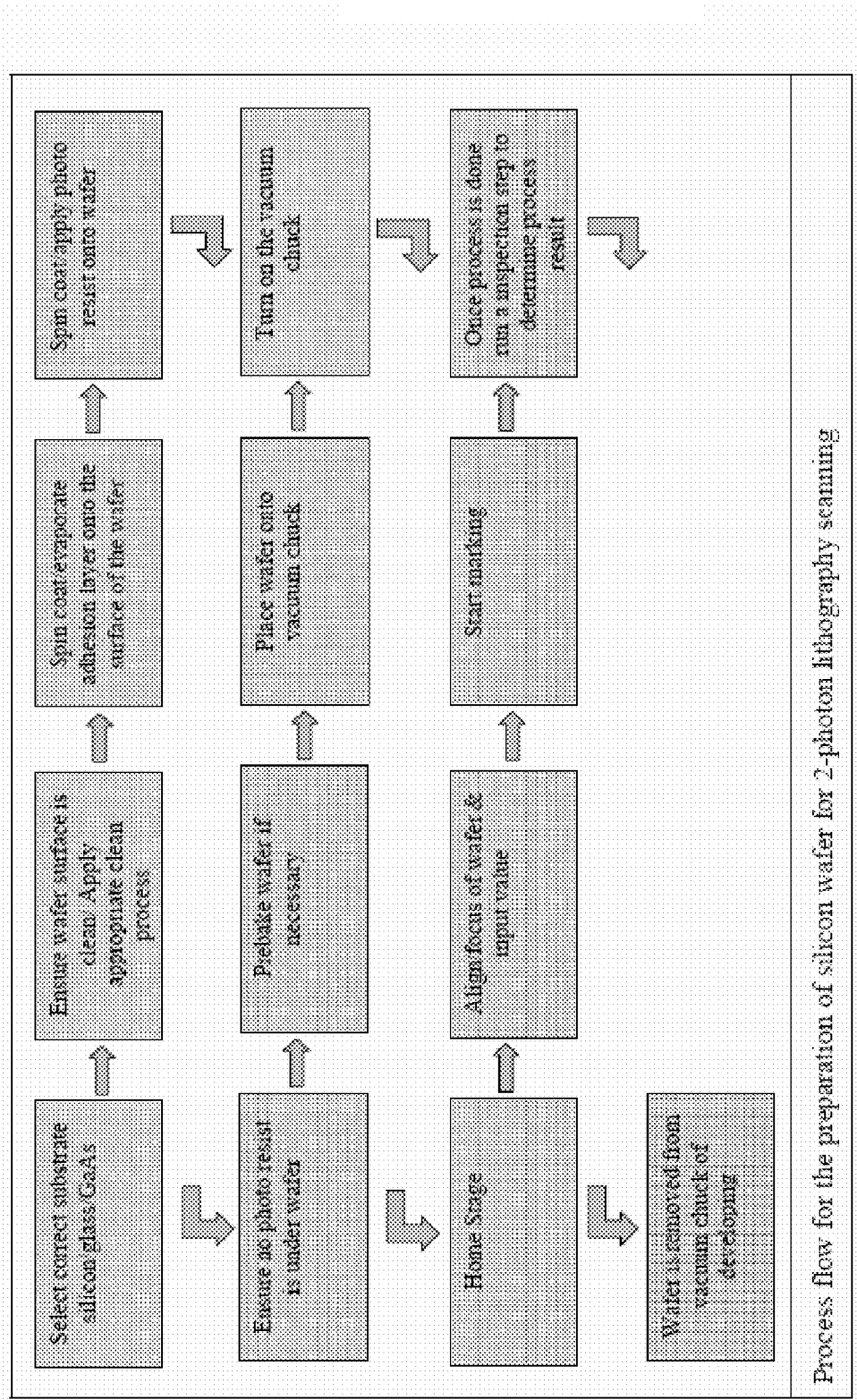
FIG. 4 is a process flow for the preparation of a substrate for the step of 2-photon lithography scanning in this inventive process.

FIG. 4 is a process flow for the preparation of substrate for the 2-photon lithography scanning. The selection of substrate type will depend on the type of stamping tool used for the production of secondary mold, device fabrication. For thermal NIL a standard silicon substrate/process is sufficient and is the process of choice as silicon wafers typically have the best surface (low root-mean-squared roughness and flatness) for laser writing. For SFIL, a transparent substrate will be required such as a glass wafer or substrate.

The choice of substrate will affect the scanning process, due to these differences:
a) adhesion layers will have to be used,
b) glass has less reflection and a higher scanning power is required,
c) glass wafers are not as flat as silicon wafer and the laser scanning process might produce poor yields.

With reference to the process flow of FIG. 4, a generic silicon process will be described. Some modifications will be needed for other types of substrate.

1) Depending on the final application different substrates could be loaded into the tool.
   a. Silicon for most thermal NIL processes
   b. Glass and other transparent substrate for SFIL applications 2) For silicon wafer perform a piranha clean (using a hot sulfuric acid cleaning process such as described in "Silicon Processing for the VSLI Era Vol. 1-Process Technology Chapter 15 "Wet Processing: Cleaning and Etching" by Stanley Wolf & Richard N Tauber, 1986 Lattice Press)

3) For glass substrate, dip wafer into dilute Hydrofluoric Acid for 30 seconds and rinse with de-ionized ("DI") water for 2 min. Blow dry the substrate and glass substrate is ready for use.

4) Spin coat/evaporate correct adhesion layer (depending on the resist and substrate type, this could differ) onto the substrate.

5) Spin coat correct resist onto the substrate. Once again this could differ significantly depending on applications.

6) Remove any photo resist that is on the back side of the substrate with correct solvent.

7) Pre bake the substrate, if necessary. (This would drive out the excess solvent and minimize shrinkage of structure after processing).

8) Place substrate on vacuum chuck and turn on the vacuum.

9) Home the stage.

10) Align wafer, input correct process parameters for the correct substrate type, photo resists.

11) Start the marking process.

12) After the process has been completed, check the substrate to ensure that every device is correctly positioned with the built in contrast feature of the 2-photon lithography tool.

13) Finally remove the substrate for resist developing.

Figure 5:
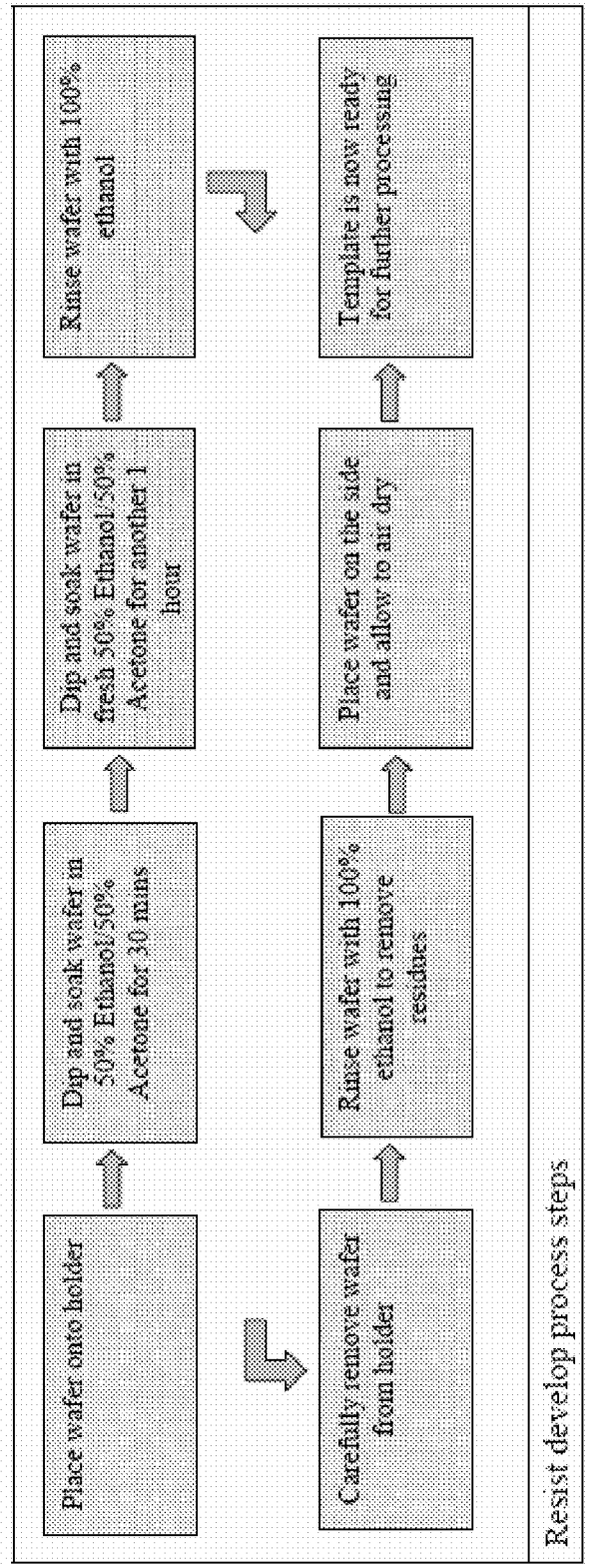
FIG. 5 is a process flow for the step of developing a photo resist in this inventive process.

FIG. 5 illustrates a process flow for developing a photo resist in this inventive process. The process flow for photo resist developing is different for different types of resist. The process flow described below is for PMMA based photo resist on glass or silicon wafers. The developer used could be modified with other chemicals depending on the application, thickness, and the marking process.

Other precaution that has to be taken would be to ensure that the drying process of 3D device does not cause the devices to collapse, and standard MEMS processing techniques such as critical point drying of the substrate will have to be performed.

1) Place the wafer into a wafer holder.

2) Dip the wafer into the developer. This could vary based on type of photoresist being used.

3) The soak time of the wafer in developer depends on the thickness of the photo resist being used and if there are deep undercuts in the design.

4) After soaking the wafer in the developer for a sufficient length of time, dip wafer into fresh developer for another 1 hour.

5) Rinse the wafer with correct solvent or with DI water.

6) And finally allowing the wafer to dry. Either with a spin drying process, air dry or critical point drying.

7) The sample is now ready for further processing.

Depending on the applications of mold, the mold developed at this stage could be used for stamping, e.g. simple NIL research and development applications. For most applications, a metal mold such as nickel would be needed.

Figure 6:
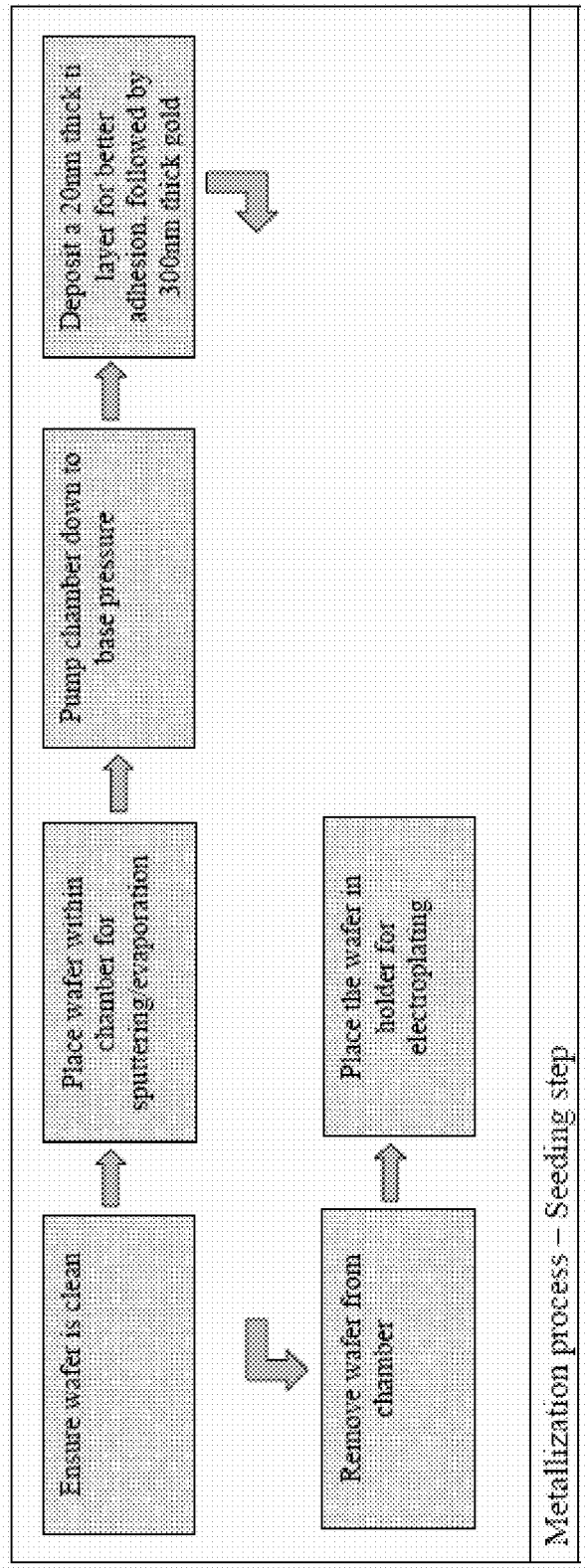
FIG. 6 is a step of forming a seed metal layer which is sputtered onto the surface of the resist/polymer in this inventive process.

FIG. 6 is a step of forming a seed metal layer which is sputtered onto the surface of the resist/polymer of this inventive process. This step of seeding leads up to the step of metallization wherein the transfer of the polymer image is carried out using an electroplating process The transfer of the polymer image to the metal mold is done with an electroplating process. Unfortunately the polymer coated surface of the substrate is not conductive and will not be a good electrode for electroplating. Consequently, a seed metal layer of or nickel is required to be either sputtered or evaporated onto the surface of the resist/polymer.

A typical step of forming the seed layer process is described in the process flow with reference to FIG. 6.

1) Ensure that there are no residues from the previous process step.
2) Place the wafer in an evaporation tool or sputtering tool.
3) Pump the chamber down to base pressure.
4) Perform a short plasma clean process to ensure surface is clean.
5) Deposit 20 nm thick Titanium layer
6) Next followed by a 300 nm thick layer of gold.
7) Remove wafer from chamber.

The substrate is now ready for electroplating.

Figure 7:
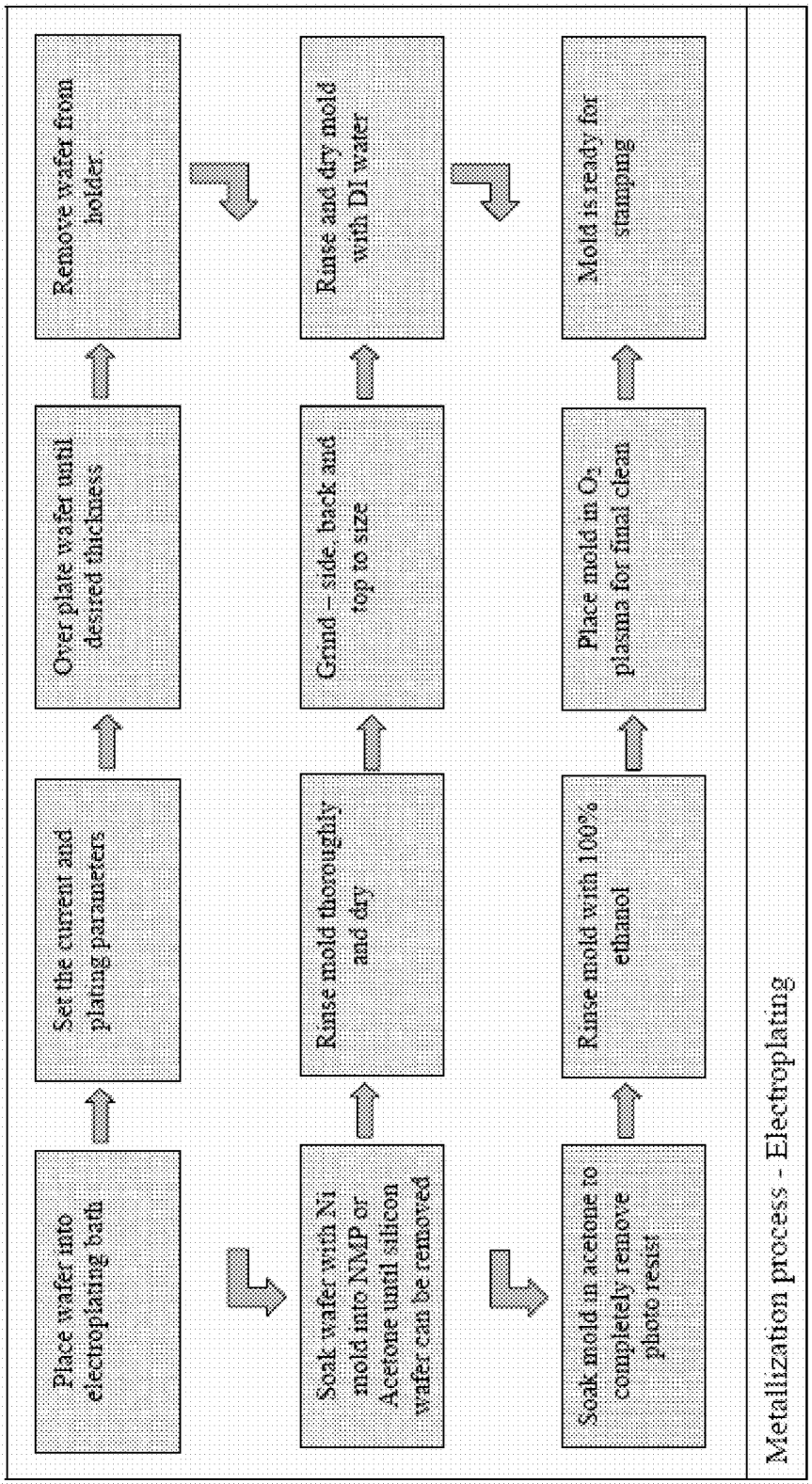
FIG. 7 is the step of metallization to form a metal mold of this inventive process wherein the transfer of the polymer image is carried out using an electroplating process using a seed metal layer which is sputtered onto the surface of the resist/polymer.

FIG. 7 is the step of metallization to form a metal mold of this inventive process wherein the transfer of the polymer image is carried out using an electroplating process using a seed metal layer which has been sputtered onto the surface of the resist/polymer. The metal mold is formed entirely by an electroplating process, which is described in these steps, with reference to FIG. 7:

1) The substrate with the seed metal layer is placed in the electroplating bath.
2) Next set the electroplating parameters.
3) Over plate until desired thickness—typically in the range of 3-5 mm.
4) Remove wafer from holder.
5) Remove the resist from the mold. This could be typically performed with a resist stripper or hot acetone. At this point the silicon/glass substrate will be removed.
6) Rinse the mold thoroughly with DI water.
7) Next grind the back and edges of the mold to size.
8) Rinse the mold in DI water.
9) Perform $O_2$ plasma clean on the surface of mold.

The mold is now ready for use. Typical mold size would be about 4 mm.times.20 mm in size and would not be suitable for use for high throughput applications. Such applications would have to use the mold to produce functional raw materials (functional films). In this case a secondary mold would be needed. The fabrication of such a secondary mold will be described in details below.

Figure 8:
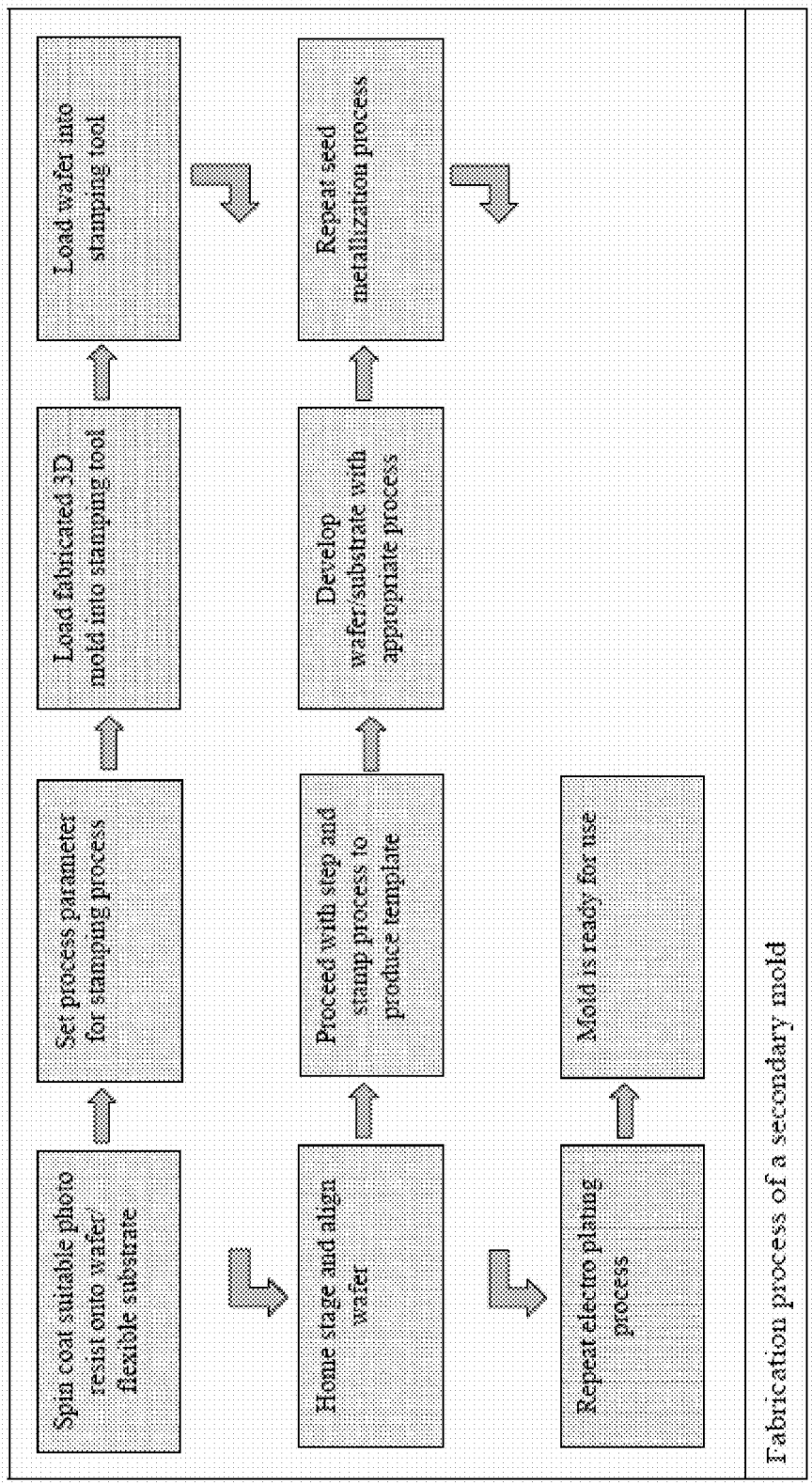
FIG. 8 is a step of fabricating the secondary mold in this inventive process.

FIG. 8 is a step of fabricating the secondary mold in this inventive process. For many applications, the pattern required by the user is periodic (repeated). The write time for the 2-photon lithography tool is long and expensive. To minimize the write time, the master mold will be used to produce a larger secondary mold by using a stamping tool, for the following reasons:

1) By using the 3D master mold produced with the 2-photon lithography tool and stamping onto a resist/polymer coated substrate, a much larger mold could be fabricated. This would help reduce the necessary write time to replicate a large mold.
2) Reduce any chance of error.
3) Increase yield.
4) Very large surface area could be produced fairly quickly.

The process flow for the step of fabricating the secondary mold is described below with reference to FIG. 8:

1) First spin coat a suitable resists/polymer onto the surface of a substrate. This substrate could be silicon wafer, large sheet of polymer, sheet metal, glass. (Depending on the applications of the final product.)
2) Depending on the type of substrate and resists used in the process, key in the correct parameters of the stamping process into embossing/stamping tool.
3) Load the master mold into a stamping tool and start stepping the pattern over the entire substrate.
4) Next the patterned substrate is developed and a seed metal layer is sputtered over the pattern substrate.
5) The substrate is then dipped into an electroplating bath and over plated to the desired thickness.
6) The final device is then grinded to the correct thickness
7) Edge of the mold is also grinded to the correct thickness By using the master mold to step over many times over a large area, technically molds that are fairly large (1 $m^2$) can be fabricated.

For high throughput application and continuous fabrication of large sheets of functional polymer films, a roller mold could be fabricated.

Figure 9:
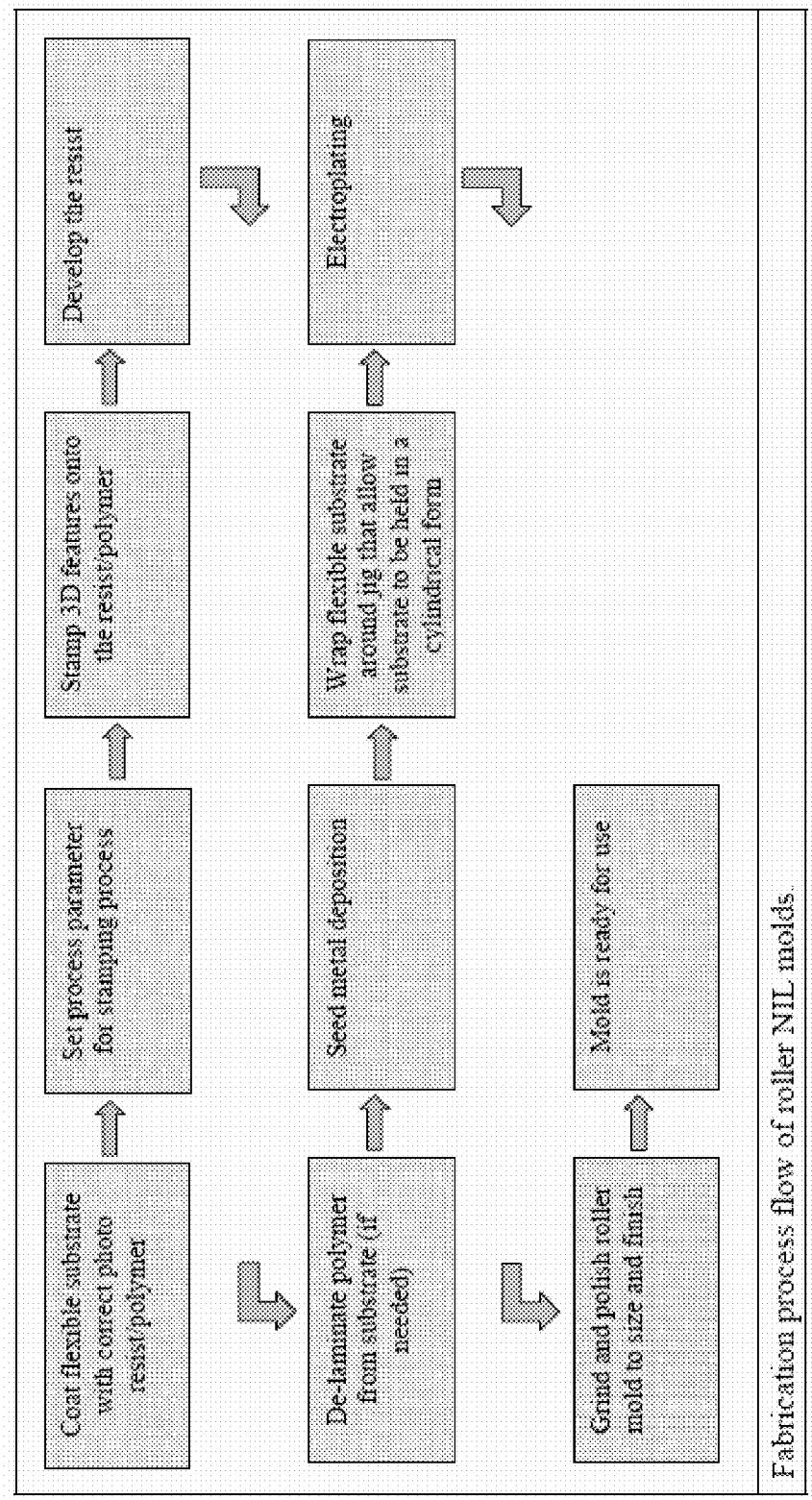
FIG. 9 is a step of fabricating the roller NIL molds in this inventive process.

FIG. 9 is a step of fabricating the roller NIL molds in this inventive process. As explained in the earlier section large sheet of functional materials might be needed for certain applications. Current methods of imprint large surface areas are achieved through the use of roller imprinter, where a roller with nanometer scales 3D features is continuously used to mold a large continuous sheet of polymer.

The step of fabricating the roller NIL mold is illustrated by reference to FIG. 9.

1) First coat a suitable substrate with photo resist. Some of the possible substrate could be PMMA films, sheet metal, silicon wafers, glass etc.
2) Next set the process parameter for the stamping tool.
3) Transfer the 3D image from master mold onto the large substrate through a series of stamp and step sequence.
4) Develop resist after processing.
5) De-laminate resist/polymer from substrate.
6) Deposit a seed metal layer onto the surface of the substrate.
7) Wrap the flexible substrate over a jig to form a cylinder.
8) Electroplate cylinder till desired thickness. The minimum thickness will have to be greater than 3 mm.
9) Grind and polish the nickel cylinder to the correct finish and thickness.
10) Roller mold is now ready for use.

The invention can also cater for the manufacture of layers having features on both its upper layer and lower layer using 2 roller molds. In such applications, The 2 roller molds can be aligned on top of each other. For simple 2 layer structures, a single pass through the double mold will be sufficient. For more complex structures that require more layers, each layer could be aligned by zipping it together. These structures could be used to hold the film together and align the different layers. The first layer and second layer will be aligned when they are zipped together. Each layer is then adhered onto each other to form multiple layer structures.

Fabrication of Flexible Molds

Figure 17:
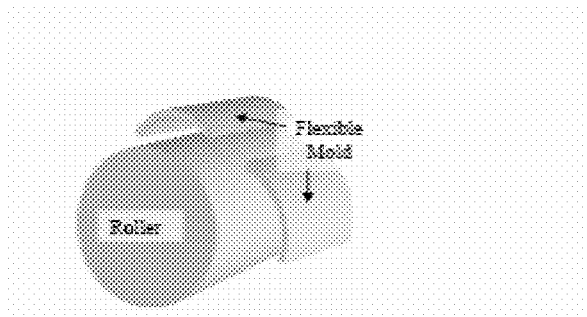
FIG. 17 is a roller with a flexible mold.

Flexible roller imprinter molds for nanoimprinting could be used for the imprinting of 3D structures. Flexible molds made of sheet metals or polymers with features patterned on the surface could be wrapped around a large roller as illustrated in FIG. 17.

Figure 18:
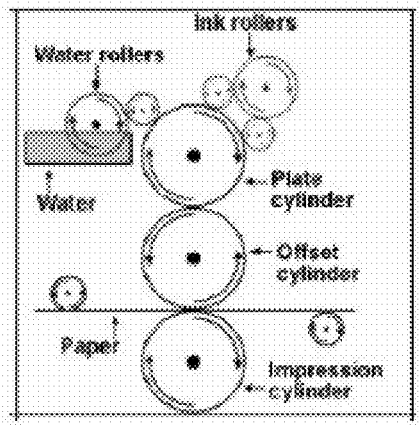
FIG. 18 shows an approach used in offset printing.

A large roller mold can be formed by attaching several flexible molds onto the surface of the cylinder. This approach is fairly similar to offset printing in the printing industry where aluminium sheets with photosensitive chemicals are exposed to transfer the print image onto the plate and attached onto the plate cylinder, as illustrated in FIG. 18.

The flexible molds/plates are attached onto slits that are designed on the surface of the roller and roughly aligned into position by notches on the edges of the flexible mold/plates. Fine alignment is then done by adjusting the positions of the rollers and polymer feed. With this setup alignment accuracy of up to 10 microns or less with top and bottom imprinting can be achieved.

There are many ways a flexible mold could be created using the master 3D mold created using 2-photon lithography:
1) Flexible polymer mold;
2) Sheet metal mold with polymer features;
3) Sheet aluminium (soft metal) mold with metal feature stamped on using a thicker master mold; and
4) Sheet metal mold that has metal features electroplated onto surface An example of a process flow using different types of flexible molds is described in the following sections.

Process Flow for Making a Flexible Polymer Mold/Template

Figure 10:
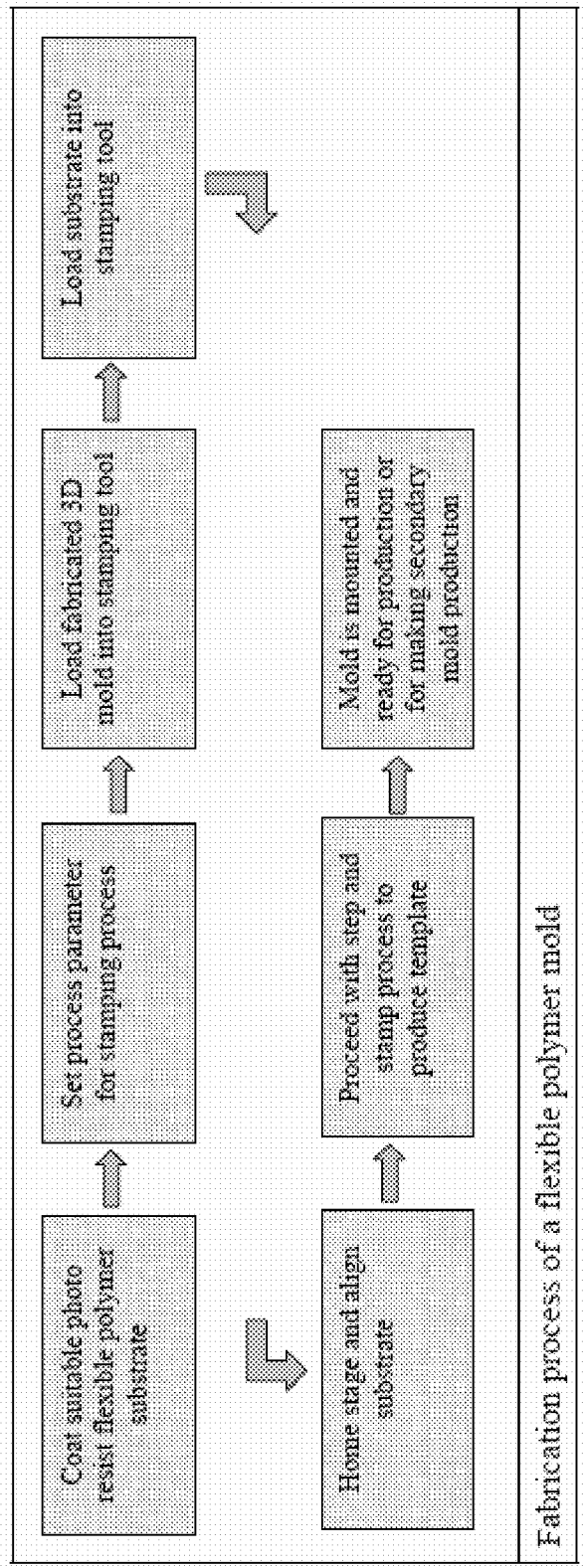
FIG. 10 is an illustration of a process flow for making a flexible polymer mold or template.

The process flow for making a flexible polymer mold/template is described with reference to FIG. 10.

In this process a flexible mold that is made from a sheet metal or polymer substrate can be produced.

1) First coat a suitable resists/polymer onto the surface of a flexible substrate. This substrate could be a large sheet of polymer or sheet metal. (depending on the applications of the final product.)
2) Depending on the type of substrate and resists used in the process, key in the correct parameters of the stamping process into the stamping tool. The stamping process can either be a UV imprinting process or thermal imprinting process or a combination of both.
3) Load the master mold into a stamping tool and start stepping the pattern over the entire substrate.
4) The polymer film can now be used as a secondary mold or as a production mold wrapped over a roller.

Process Flow for Making a Metal Mold or Template Using Physical Stamping of an Aluminum Sheet.

Figure 11:
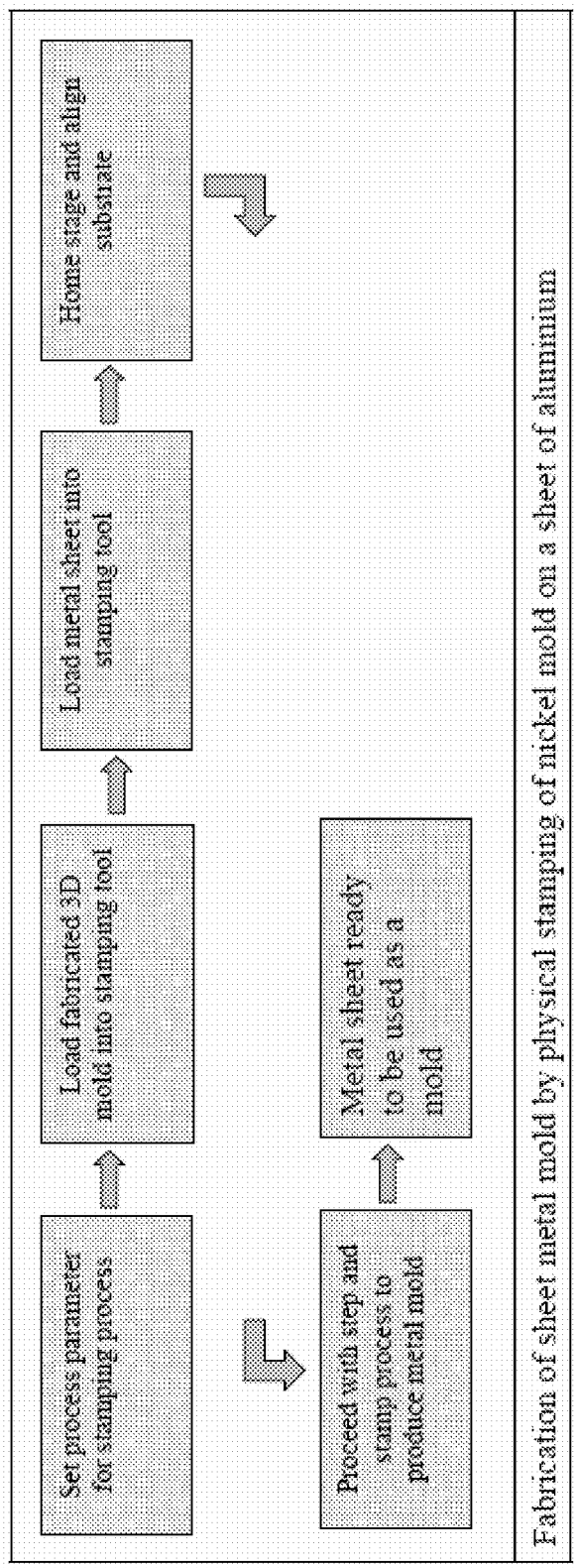
FIG. 11 is an illustration of a process flow for making a metal mold or template using physical stamping of an aluminum sheet.

The process flow for making a metal mold or template using physical stamping of an aluminum sheet is described with reference to FIG. 11.

In this process a flexible mold is made from a sheet metal by physically stamping onto a soft metal using a nickel mold.

1) Set the process parameter
2) Install the correct mold for stamping (mold will have to be made from a harder metal such as nickel.
3) First load the sheet metal, into the stamping tool.
4) Proceed with the sample process.
5) The sheet metal can now be used as a secondary mold or as a production mold wrapped over a roller.

Process Flow for Making a Sheet Metal Mold or Template with Metal Features Electroplated onto the Surface.

Figure 12:
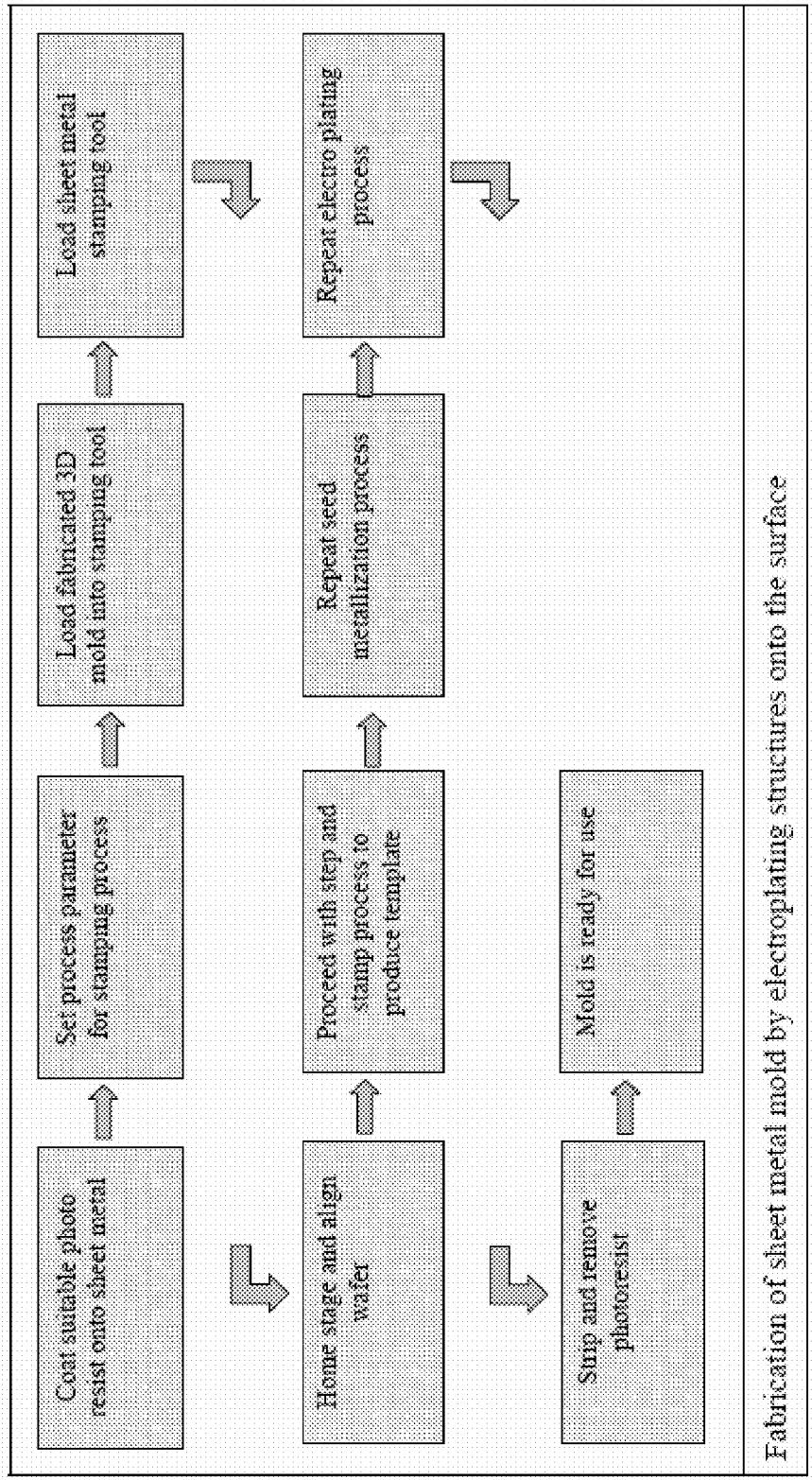
FIG. 12 is an illustration of a process flow for making a sheet metal mold or template with metal features electroplated onto the surface.

The process flow for making a sheet metal mold or template with metal features electroplated onto the surface is described with reference to FIG. 12 and is as follows:

1) Coat photoresist onto the surface of sheet metal.
2) Input the correct process parameters.
3) Load 3D mold into the stamping tools.
4) Load sheet metal into tool.
5) Proceed with stamping process.
6) Deposit seed metal or apply a clean step to expose the sheet metal at the bottom of the polymer structure for electroplating.
7) Perform electroplating.
8) Strip and remove photoresist from metal sheet. Process Flow for Making a Sheet Metal Mold or Template with Polymer Features.

Figure 13:
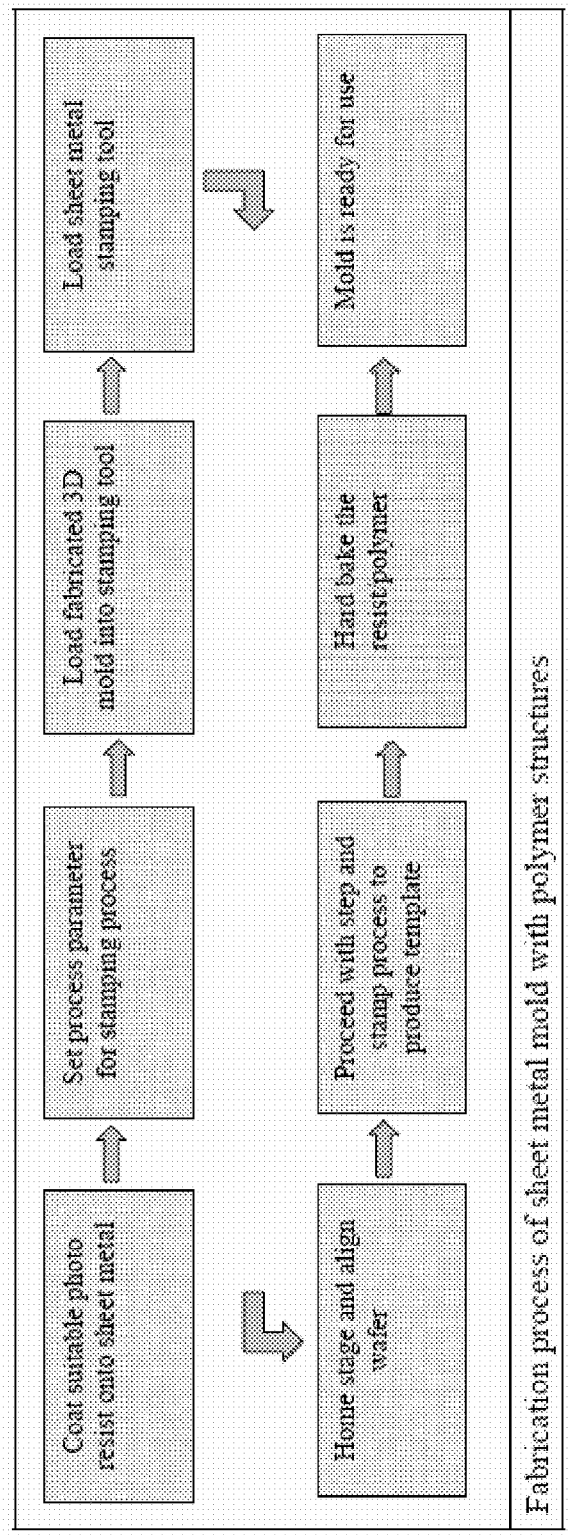
FIG. 13 is an illustration of a process flow for making a sheet metal mold or template with polymer features.
Figure 14:
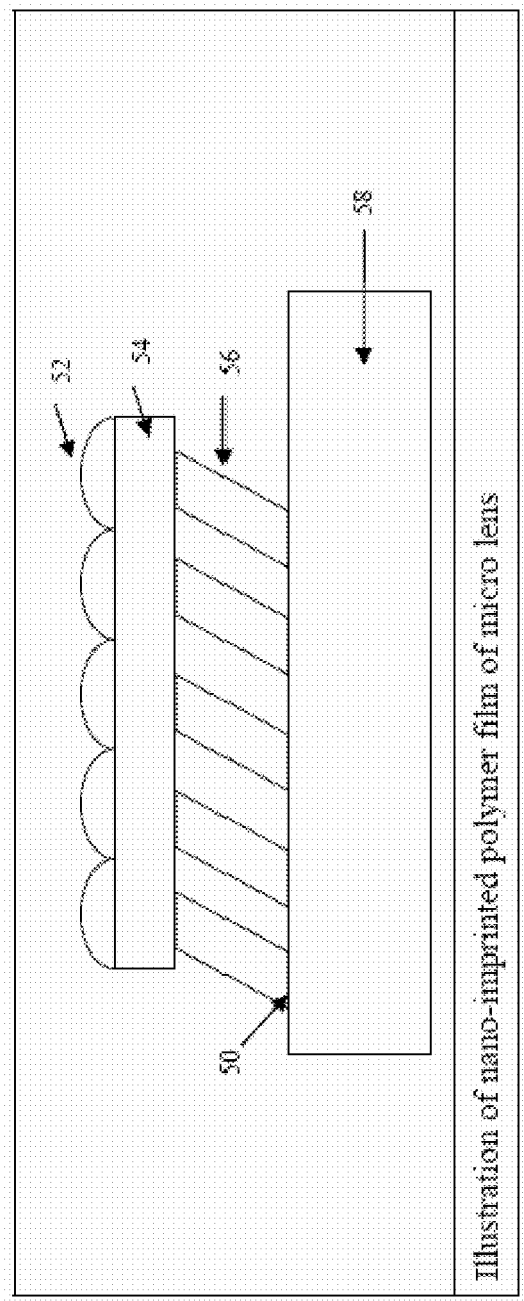
FIG. 14 is an illustration of a nano-imprinted polymer film of micro-lens in the manufacture of a side emitting thin film layer.
Figure 15:
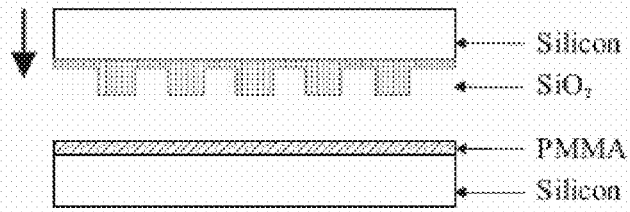
FIG. 15 is a flowchart showing steps in nano imprint lithography process
Figure 15:
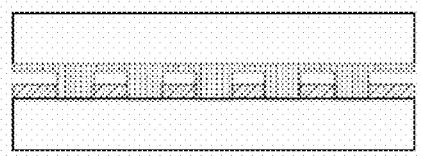
Figure 15:
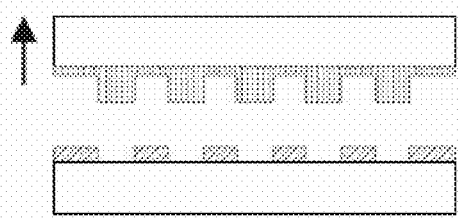
Figure 16:
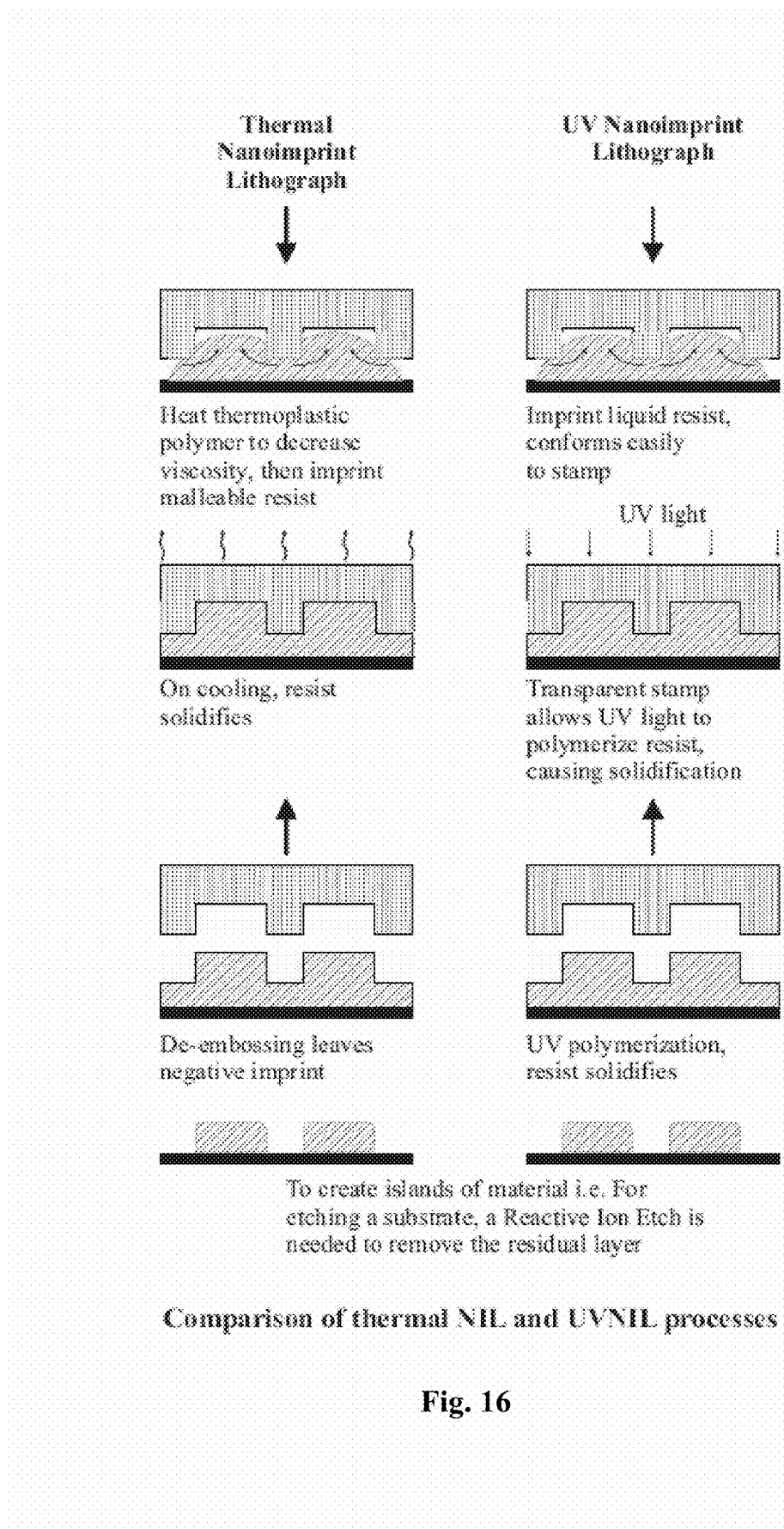
FIG. 16 is a comparison of thermal NIL and UVNIL processes.

The process flow for making a sheet metal mold or template with polymer features is described with reference to FIG. 13 and is as follows:

1) Coat photoresist onto the surface of sheet metal.
2) Input the correct process parameters.
3) Load 3D mold into the stamping tools.
4) Load sheet metal into tool.
5) Proceed with stamping process.
6) Post process the polymer to harden the polymer.
7) The mold is ready for use.

Applications of the Inventive Process

Figure 19:
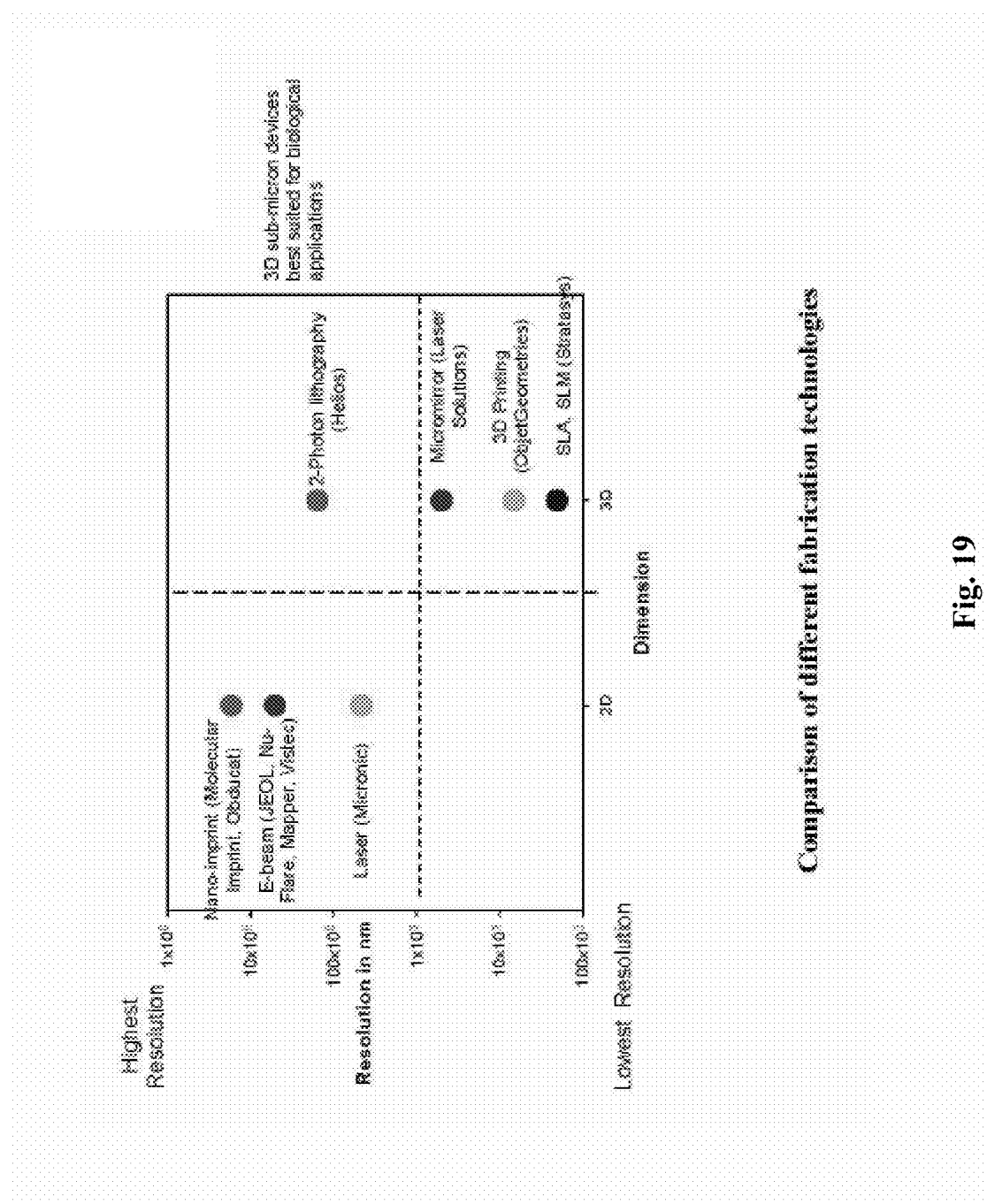
FIG. 19 shows a graph showing comparative advantages of different fabrication technologies.

A comparative advantages of the different fabrication technologies is shown in FIG. 19. By combining 2-photon lithography and nanoimprint, the invention will enable mass-manufacture of devices at a very low cost compared to all the competing manufacturing technologies.

From the matrix of different fabrication technologies, it can be seen that the inventive process is best suited for biological applications. The biological applications using this inventive process is fairly similar to clinical approaches to organ transplantation and existing grafting techniques. Instead of using biomaterial scavenged from cadavers, a totally synthetic scaffold is manufactured to minimize issues of disease transmission, shortage of suitable cadavers and lower cost.

First a 3D template that is created using 2-photon lithography or other types of rapid prototyping technology (determined by the resolution of final device) is created. Next the image is transferred onto a mold by electroforming or any type of forming techniques, depending on the type of molds (flexible, hard, size, surface properties, and resolution) needed for the processing. Products that only require a single stamping process could be then produced by either standard roll-to-roll technology or through standard NIL or UV NIL technologies.

The structures are designed with a computer aided design program (CAD). Next this 3D CAD drawing is input into proprietary software used for the invention and automatically sliced into multiple layers. Layers with repeated patterns are eliminated and templates for mold making are fabricated. With this template, a master mold for each layer is fabricated to produce a hard/flexible mold for a stamping/roll-to-roll nanoimprint tool.

For applications where a single imprint step is sufficient, such as holographic tags, micro lens for focusing, LCD, bandages, the final product is packaged for sale. Other application that require more complex 3D structures could have each layers bonded onto each other to form a larger device such as a tissue scaffold, organ scaffold. With this inventive technology it is possible to produce an organ scaffold at a rate of 4/hour.

The manufacturing method includes a process for writing 3D templates for nanoimprint, through the use of 2-photon lithography. The initial template is 3D in shape (hemispherical or other shape with curved side walls) compared to typical grayscale structures, which has vertical or sloping side walls.

The process for writing 3D templates for nanoimprint which is based on the NIL process flow, includes:
Improved designs in mold manufacturing using library of shapes to establish design rules for mass manufacturing of 3D devices;
Making molds with these 3D templates; and
Use of the stamp on NIL thermal, UV, stamping and roll-to-roll technology;

The method for fabrication of organ/tissue scaffolds using 2-photon lithography to create any type of 3D structures and nanoimprint to create whole organ scaffolds of complex organ such as kidney or liver, including the following:

a. Organ/tissue scaffolds fabricated by slicing a 3D CAD design of the scaffold into multiple layers. Each layer is individually fabricated using nanoimprint and overlay and bonded forming the final scaffolds. With this technique scaffolds that are anatomically similar to in vivo physical environment is created.

b. Tissue engineering scaffolds, including plant tissue.
c. Fabrication of medical implantable devices.

The method for fabricating simple 3D structures, such as sinusoidal structures and hemispheres, in a single pass, can be used in photonics, LCD industry, holographic tags, micro lens for focusing, bandages.

The method for fabricating simple 3D structures wherein the material used in the NIL process could be either synthetic or biological material.

This manufacturing technology can be used for organ/tissue engineering scaffold fabrication.

The inventive process is the enabling technology for organ/tissue engineering and key innovations which are listed below.

Fabrication of Organ/Tissue Scaffolds with 3D Nanoimprint Technology

Conventional scaffolds methods for scaffold fabrication include techniques such as solvent casting and particulate leaching, gas foaming, fiber meshes and fiber bonding, phase separation, melt molding, emulsion freeze drying, solution casting and freeze drying. There are several limitations involving these processing techniques such as lack of precise control of pore sizes, pore geometry, pore interconnectivity, spatial distribution of pore, and construction of internal channels within the scaffolds. In addition many of these techniques exploit organic solvents, like chloroform or methylene chloride as a part of the process to dissolve synthetic polymers. The presence of organic solvent residues is a significant problem of conventional fabrication methods due to toxins and carcinogens to which cells are exposed if residual solvent exists.

An alternative approach to scaffold fabrication is through the use of advance manufacturing technologies/rapid prototyping (RP) technologies such stereolithography (SLA) selective laser sintering (SLS), 3D printing, fused deposition modeling (FDA) and 3D bioplotter. So far only a few research groups have demonstrated the exploitation of RP technologies in clinical applications. Within bone tissue engineering, the SLS has proven its usefulness to fabricate polycaprolactone scaffolds. Also 3D printing has been used to create negative molds into which a polyactide solution can be poured and thermally phased and separated to create nanofibrous scaffolds. The results of all biological studies show that microporousity and very fine surface features improve bone growth into scaffolds by increasing surface area for protein adsorption, increasing ionic solubility in the micro environment and providing attachment points for osteoblasts. All mentioned RP approaches have not yet lead to the construction of harmonically organized complex tissues. This is due to the lack of print resolution of current RP technologies, difficulty in embedding various cell types within intricate designs. The only technology capable of doing that right now is organ printing, some structures have been printed by this setup, printing several cell types and biomaterials simultaneously. However, this setup is not suitable for fragile cell type such as hepatoctyes. Further, the inventor has found that the biomaterial used to print the mixture obstructs cell-cell interaction required to maintain function and differentiation. A matrix to compare the different type of scaffold technologies is shown in Table below.

|   |   | Invention | Nano-imprint | RP Technologies | Conventional |
|---|---|---|---|---|---|
| 1 | Max. Resolution | ~100 nm | <100 nm | >1000 nm | <100 nm |
| 2 | Material Range | Large | Large | Limited | Large |

-continued

|   |   | Invention | Nano-imprint | RP Technologies | Conventional |
|---|---|---|---|---|---|
| 3 | Custom shape | Yes | Limited | Yes | No |
| 4 | Complex organs | Yes | No | No | No |
| 5 | 3D | Yes | Yes | Yes | No |
| 6 | Cost | Low | Low | High | Low |
| 7 | Scalability | Yes | Yes | No | Yes |

Table Showing Head-to-Head Comparison of Various Scaffold Fabrication Technologies Application of Inventive Process for Organ/Tissue Engineering Tissue engineering is an essential technology in the emerging regenerative medicine industry. It can be defined as the engineering of functional tissues and organs for the repair of diseased body parts. Autologous tissue engineered devices are formed by combining patient-derived cells with a degradable material and implanting the combination in the body. The material is termed a scaffold or matrix. It is porous or gelatinous in nature, ensuring the incorporation of cells within the substrate and not solely on the surface. The goal of tissue engineering is to circumvent the limitations of conventional clinical treatments for damaged tissue or organs based on the use of organ transplants or biomaterial implants. The most essential limitations of these treatments involve shortage of donor organs, chronic rejection and cell morbidity.

The dominant method of tissue engineering involves growing the relevant cells in vitro into a scaffold that attempts to mimic the function of extracellular matrix. Without any three dimensional supporting structures the cell will form a random two-dimensional mainly monolayer of cells. Thus the primary function of a scaffold serves as an adhesion substrate for the cell. In addition the scaffold provides temporary mechanical support and guidance to the growing tissue.

In recent years various researchers have relied on decellularized organs, heart and thorax, from cadavers to provide architecture, geometry and cellular constituents to build bioartificial organs. These scaffolds are reseeded with cells and cultured in a perfused bioreactor for weeks and the resultant construct could perform some or most functions of an organ. In other simple organs such as the cornea, bladder, skin and bone the organ scaffold matrix was replaced with a totally synthetic scaffold.

The clinical success in the reports from the previous paragraph suggests that the approach of providing 3D scaffold support is the best approach to regenerative medicine. However, to harvest scaffolds from cadavers is a serial process and have many issues associated with this technique, such as transmission of diseases, number of cadavers available, skilled surgeons to extract the parts, ethical and quality control issues. With the inventive technology, a physiologically similar environment, and with the correct chemical signals, totally synthetic organ/tissue scaffold could be recreated for regenerative medicine.

There is a clear need for the development of tissue engineered organs. However, the main problems for the engineering of more complex tissues are angiogenesis, growing blood vessels to supply the new tissue with blood, and developing 3D matrices on which to grow new tissue.

The use of cheap, high throughput, high resolution and 3D manufacturing technology of the invention offers a solution to the problems faced by researchers in developing a vascularized, 3D matrix. This would further the cause of tissue engineering research and improve healthcare in general. Other biomedical applications for these scaffolds, when used in cell culture, could be used to develop better drug models for pharmaceutical companies to perform drug testing, lower the cost of clinical trials, and drug development.

The inventive process has wide ranging applications, some of which are listed below

| | Application/ Industry | 3D technology critical to industry? | Will 3D technology improve technology? | Will Invention improve technology? | Industry size/Stage of development |
|---|---|---|---|---|---|
| 1 | Organ/Tissue Engineering Scaffold | Yes | Yes | Yes | Potentially Large, Emerging |
| 2 | Hybrid Plastic/ Organic Electronics | No | Yes | Yes | Large Emerging |
| 3 | Silicon/Gallium Arsenic Devices | No | No | No | Large, Mature |
| 4 | Organic Lasers | No | Yes | Yes | Potentially Large, Evolving |
| 5 | Photonics | Yes | Yes | Yes | Large, Evolving |
| 6 | LCD | No | Yes | Yes | Large, Evolving |
| 7 | Micro-fluidics | No | Yes | Yes | Potentially Large, Evolving |
| 8 | Biotech | Yes | Yes | Yes | Potentially Large, Evolving |
| 9 | Hard Drive | No | Yes | No | Large, Mature |

Table Showing Possible Applications from Technology Developed Under this Invention.

The application of the invention to tissue engineering can be extended to plants and agricultural sectors.

Application of Inventive Process to Manufacture of Micro-Lens

Controlling and modulating light can be done through a variety of ways using refractive, diffractive, interference or reflective methods. This can be carried through manipulating light through micro-lens. Micro-lens produced by the inventive process can be designed to contour the surface/interfaces of the lens to focus, reflect, guide and bend light. Through miniaturization of the lens systems, the bulk of most lens material are removed, with improved transmission and efficiency since there are less signal attenuation, caused by bulk absorption. These lenses are integrated into films to produce functional optical films.

Currently micro-lens are fabricated by molds formed by 1) melting molten glass/photoresist/liquids and allowing the surface tension to form the smooth spherical surfaces required for lens. 2) Other techniques involve the repeated etching patterns to form arrays of multiple lenses. Multiple copies of these arrays are formed by molding or embossing from a master lens array.

Current thin film PV modules manufactured are plagued by poor reliability of their panels. This is caused by the breakdown of the film over time due to absorption of UV light that breaks down unsaturated bonds in the polymers and chemicals causing a reduction in efficiency. Optical films developed by the inventive process could be used to filter out the UV light without attenuating the other part of the light spectrum before delivering the light to the PV panel.

Most of the sub-micron devices fabricated is 2D in nature. Fabrication of curved side walls which is required to manufacture micro-lens is also very difficult with existing art. By introducing an extra dimension into the fabrication process will enable designers to exploit extra surfaces for novel applications.

1) This would mean that compound micro-lens with custom designed curvature can be produced.

2) From these devices, functional films with novel applications, such as for collecting, transporting and manipulating light can be fabricated.

The mold made by this inventive process not only enable fabrication of small devices with curved side walls but allows stamping of the mold onto softer material, fabricating shapes such as non-spherical and specially designed lens, with curvatures not limited by the properties of the surface tensions of the liquid used for making micro-lens.

Such optical films are of interest to solar PV manufacturers, as these films can be incorporated onto the surface of the thin film or glass to reduce reflection, total internal reflection, collect light and focusing it onto the active devices. Although direct application of film on PV panel is able to provide a modest incremental in efficiency, this film could also function like a light collector. This is done by collecting light at on the flat surface, bend it such that total internal reflection conditions are met within the film and guide the light through the film, finally emitting through the edge of the film. The intensity of the light emitted at the edge of the film will be a direct function of surface area of film. By incorporating films to collect light and piping it to the PV, the PV will be exposed to more light than previously possible. These films are flat, low cost and could be deployed into onto any surface to collect light and delivering it to PV panels that might otherwise not optimally positioned to absorb light. (e.g. urban areas)

Besides using the functional films in the solar PV industries, other applications include display technologies.

1) With such functional films it can be applied in solar power generation by, collecting, delivering, and focusing onto PV panels. The PV panels could be installed in such a way, that it is not exposed to extreme weather conditions, while providing light energy of many suns to the PV films of comparable surface area.

2) These films could also be designed as optical film, to deliver and focus light onto the pixels of LCD screens and flexible electronic applications, When such films are applied to the PV module light it serves several functions, 1) anti-reflection film, 2) collect light, 3) transport light and 4) focus/concentrate light. This will maximize the amount of light collected absorbed on to the PVs. This would mean high PV efficiencies, easier panel installations and much lower cost.

The micro-lens manufactured by this inventive process can be used for channeling light from the exterior into the interior of buildings.

Other Applications

Simple single layer process have many applications such as fabricating non-symmetric micro grating for LCD applications, miniaturization of optical components for communications, and micro lens to focus light onto photovoltaic device for efficient collection of light in green energy applications.

ADVANTAGEOUS EFFECTS OF THE INVENTION

By combining 2D lithography and nanoimprint technology, high resolution sub micron 3D molds of each layer of 3D structures can be fabricated, at low cost. Each layer is then built to form the 3D structure. Besides the applications discussed herein like organ/tissue engineering, many new applications of nanoimprint such as LCD monitor industry, contact lens industry, surface texturing of plastic products, semi conductor industry and hard drive industry and even counterfeiting technology can use the inventive process.

The invention claimed is:

1. A micro-lens, comprising:
a plurality of individually molded layers imprinted on top of one another using a nano-imprinting process, each layer of said plurality of layers having a width and a thickness, wherein each layer of said plurality of layers is imprinted using a mold formed from a polymer template fabricated using two-photon lithography;
wherein the polymer template for each mold is designed using a computer assisted drawing (CAD) software program;
wherein the width of each layer of said plurality of layers is varied by designing each polymer template using said CAD software program, such that the plurality of individually molded layers creates a curved surface.

2. The micro-lens of claim 1, wherein said curved surface is contoured to focus, reflect, guide and bend light.

3. The micro-lens of claim 1, wherein said curved surface is non-spherical.

4. The micro-lens of claim 1, wherein said curved surface is asymmetric.

5. The micro-lens of claim 1, wherein the thickness of each layer of said plurality of layers is between 0.01 micron and 150 microns.

6. The micro-lens of claim 5, wherein the thickness of each layer of said plurality of layers is less than 1 micron.

7. The micro-lens of claim 5, wherein the thickness of each layer of said plurality of layers is 100 nm.

8. The micro-lens of claim 1, wherein said micro-lens is a compound lens.

9. The micro-lens of claim 8, wherein said curved surface comprises a custom designed curvature using said CAD software program.

10. The micro-lens of claim 4, wherein said micro-lens is hemispherical.

11. The micro-lens of claim 1, wherein each layer of said plurality of layers comprises a sheet of polymer film.

12. The micro-lens of claim 1, wherein each layer of said plurality of layers is imprinted using a 3D mold formed form a polymer template fabricated using two-photon lithography.

13. The micro-lens of claim 12, wherein said 3D mold comprises curved side walls.

14. The micro-lens of claim 1, wherein each layer of said plurality of layers is imprinted using a roller mold formed form a polymer template fabricated using two-photon lithography.

* * * * *